United States Patent
Ishiguro et al.

(10) Patent No.: US 7,024,947 B2
(45) Date of Patent: Apr. 11, 2006

(54) DETECTION DEVICE INCLUDING CIRCUIT COMPONENT

(75) Inventors: Katsuyuki Ishiguro, Miyagi-ken (JP); Yasuichi Ono, Miyagi-ken (JP); Kazuo Hasegawa, Miyagi-ken (JP); Daiichi Hashimoto, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 10 days.

(21) Appl. No.: 10/377,679

(22) Filed: Feb. 28, 2003

(65) Prior Publication Data

US 2003/0167850 A1 Sep. 11, 2003

(30) Foreign Application Priority Data

Mar. 7, 2002 (JP) ............................. 2002-062733
May 14, 2002 (JP) ............................. 2002-139313

(51) Int. Cl.
  *G01L 1/04* (2006.01)

(52) U.S. Cl. ............................................. 73/862.451

(58) Field of Classification Search ................ 73/780, 73/862.451, 862.043, 718, 105, 514.16, 862.637, 73/493; 324/158.1; 257/778, 685; 361/760; 165/48.1

See application file for complete search history.

(56) References Cited

U.S. PATENT DOCUMENTS

| 5,421,213 A | | 6/1995 | Okada |
| 5,604,383 A | * | 2/1997 | Matsuzaki ................... 257/778 |
| 5,748,006 A | * | 5/1998 | Sano .......................... 324/754 |
| 5,748,448 A | * | 5/1998 | Hokari ........................ 361/749 |
| 6,097,610 A | * | 8/2000 | Hashimoto ................. 361/760 |
| 6,528,870 B1 | * | 3/2003 | Fukatsu et al. ............. 257/685 |

FOREIGN PATENT DOCUMENTS

| JP | 2001-235325 | 8/2001 |
| JP | 2001-296123 A | 10/2001 |

OTHER PUBLICATIONS

Office Action dated Feb. 18, 2005 for corresponding Chinese Patent Application No. 03120001.

* cited by examiner

*Primary Examiner*—Max Noori
*Assistant Examiner*—Octavia Davis
(74) *Attorney, Agent, or Firm*—Beyer, Weaver & Thomas, LLP.

(57) ABSTRACT

A detection sensor includes a detector unit which is provided on an insulating board at a first side of the board, a circuit component which is provided on the board at a second side of the board and which processes a signal detected by the detector unit, and a wiring unit which penetrates through the board in the thickness direction of the board and connects the detector unit and the circuit component.

4 Claims, 14 Drawing Sheets

DETECTION DEVICE INCLUDING CIRCUIT COMPONENT

BACKGROUND OF THE INVENTION

1. Field of the Invention

The present invention relates to detection devices such as sensors, and more specifically relates to techniques for arranging the main body of a sensor and a circuit component for detection.

2. Description of the Related Art

In accordance with the miniaturization and functional improvements of instruments, detection devices (sensors) installed in the instruments are required to have higher detection accuracy, be smaller and lighter, and operate at lower power consumption.

For example, video cameras or the like generally include angular velocity sensors for detecting angular variation due to shaking, and output signals from such sensors are used for compensating for the shaking. Since video cameras are becoming smaller every year and the detection accuracy of the sensors greatly affects the user-friendliness, the sensors are required to have high performance.

In addition, when the size of tilt sensors, rotational angle sensors, etc., is reduced and such sensors are installed in, for example, joysticks and gamepads for home-use game machines, virtual games or the like can be played without going to large amusement arcades.

Such requirements for miniaturization and functional improvements also apply to instruments other than mobile devices and game machines.

In such detection devices (sensors), the main body of the sensor and a circuit component which processes a sensor signal are generally formed separately, and a long electric line is necessary for connecting the main body of the sensor and the circuit component. Accordingly, the electrical signal detected by a detector unit is affected by external noise when it passes through the electric line. In addition, there is a possibility that the detection accuracy will be degraded due to the parasitic capacitance of the electric line.

On the other hand, capacitive sensors which use capacitance changes have been developed to satisfy the above-described requirements for high sensitivity, low power consumption, etc. However, small capacitive sensors have small capacitances, such as less than 1 pF and capacitance changes therein are extremely small, such as about 0.02 pF to 0.03 pF. Accordingly, there is a problem in that external noise as described above greatly affects the detection accuracy.

SUMMARY OF THE INVENTION

In view of the above-described situation, an object of the present invention is to provide a small, high-accuracy detection device.

In order to attain the above-described object, a detection device according to the present invention includes a detector unit which is provided on an insulating board at a first side of the board; a circuit component which is provided on the board at a second side of the board and which processes a signal detected by the detector unit; and a wiring unit which penetrates through the board in the thickness direction of the board and connects the detector unit and the circuit component.

Accordingly, the detector unit and the circuit component can be combined together with the board therebetween, so that the structure of the sensor can be made simpler and the manufacturing costs can be reduced.

In addition, since the wiring unit penetrates through the board in the thickness direction thereof, the length of the wiring unit can be reduced and the electrical signal detected by the detector unit can be input to the circuit component over approximately the shortest distance. Accordingly, the influence of external noise, etc., can be minimized when the signal is transmitted to the circuit component and the detection accuracy can be significantly improved.

Furthermore, when the length of the wiring unit is reduced, the parasitic capacitance thereof is also reduced, so that the detection accuracy can be further improved.

The wiring unit may include a through-hole electrode which penetrates through the board in the thickness direction of the board.

The board may be constructed of a multilayer wiring board which includes a ground layer whose potential is set to a ground potential at a position between a surface of the board at the first side and a surface of the board at the second side. In such a case, the circuit component can be shielded from external noise from the first side of the board and the detector unit can be shielded from external noise from the second side of the board.

In addition, the multilayer wiring board may further include a power supply layer at a position between the ground layer and the surface of the board at the second side, and the ground layer may be disposed at a position closer to the power supply layer than to the surface of the board at the first side. In this case, the ground-layer and the power supply layer are disposed in proximity of each other, so that effects similar to those obtained when a bypass capacitor is disposed between the ground layer and the electrode supply layer can be obtained. Accordingly, a noise-absorbing bypass filter, which is usually externally attached at a position between a power supply line and a ground line, can be omitted.

In addition, the circuit component may be constructed of a bare integrated circuit chip which includes a semiconductor substrate and a circuit unit formed on the semiconductor substrate and the bare chip may be mounted on the board at the second side. In such a case, the size of the circuit component can be significantly reduced, so that a small, light detection device can be obtained.

In this case, the bare chip is preferably connected to the board at the second side such that the circuit unit faces the surface of the board at the second side by bump bonding. When the bare chip is connected to the board by bump bonding, the size of the device can be reduced compared to the case in which the bare chip is connected to the board by wire bonding. In addition, the parasitic capacitances of wires are not generated and external noise can be prevented from being induced in the wires.

In the bare chip which is mounted on the board such that the circuit unit faces the surface of the board at the second side, the semiconductor substrate may be electrically connected to a ground pattern such as the above-described ground layer formed on the board. In this case, the potential of the peripheral portion around the circuit unit of the bare chip is set to the ground potential, so that the circuit unit can be more effectively shielded and the influence of external noise can be further reduced. Accordingly, even when the detector unit is constructed as a capacitive sensor which detects a slight capacitance change, it is not easily affected by noise and can perform detection with high accuracy.

The above-described board may be provided with a plurality of external connection electrodes which are electrically connected to the circuit component. In this case, the detection device can be easily mounted on a mount board, and the detection device can be handled as if it is an electrical component.

In the above-described detection device, the detector unit may include a detection electrode and a counter electrode, the detection electrode being provided on the board at the first side and the counter electrode being disposed such that the counter electrode faces the detection electrode and being movable with respect to the detection electrode, and be constructed as a capacitive sensor which detects a capacitance between the detection electrode and the counter electrode.

In addition, the detector unit may include a pair of comb-like detection electrodes provided on the board at the first side, and be constructed as a capacitive sensor which detects a capacitance between the comb-like detection electrodes.

In addition, the detector unit may include an elastic member provided on the board at the first side and a strain sensitive resistor provided on the elastic member, and be constructed as a resistive strain sensor which detects a resistance of the strain sensitive resistor.

In addition, the detector unit may include a coil provided on the board at the first side, and be constructed as a magnetic sensor which detects an inductance of the coil.

DESCRIPTION OF THE PREFERRED EMBODIMENTS

Embodiments of the present invention will be described below with reference to the accompanying drawings.

Figure 1:
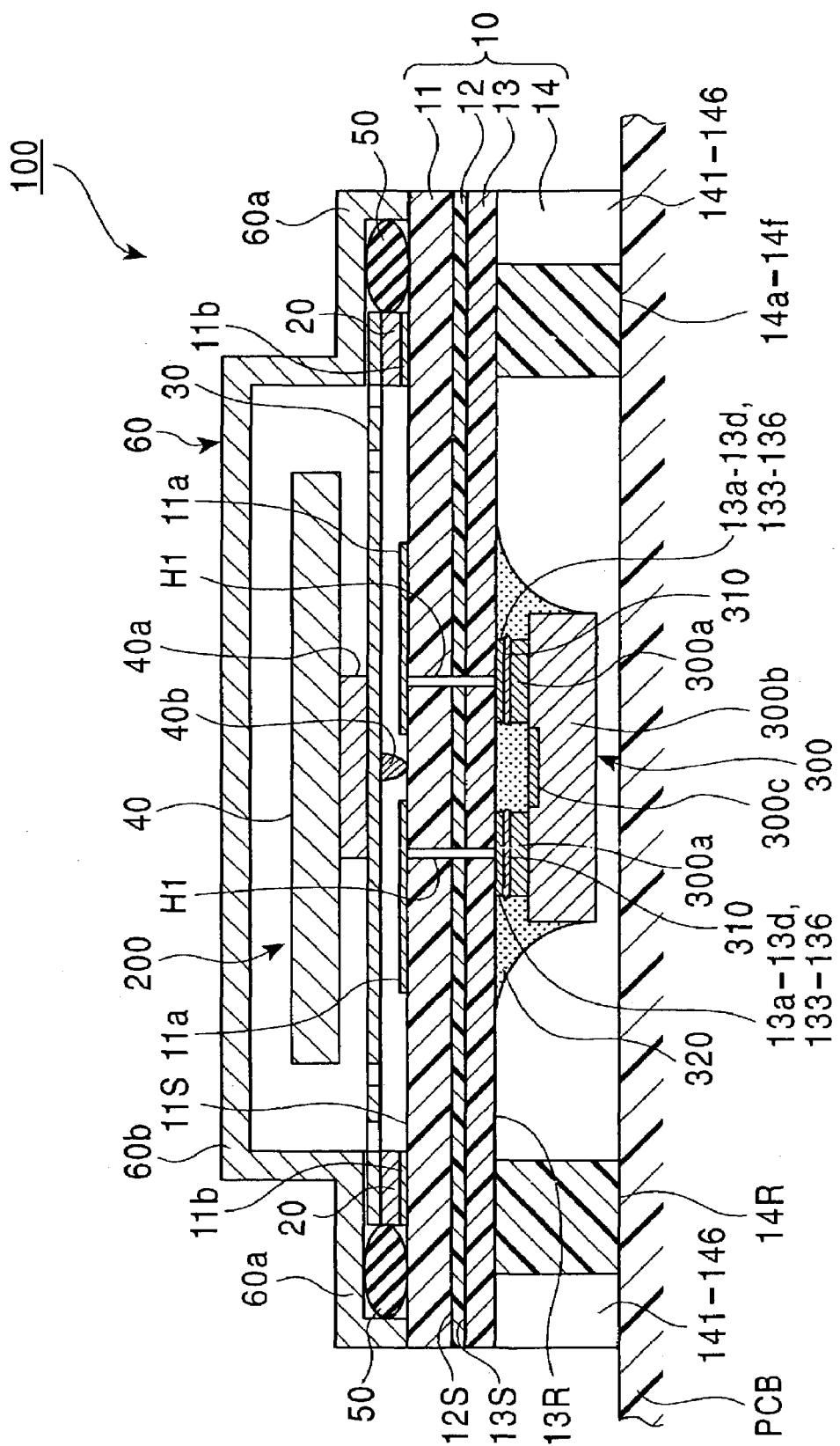
FIG. 1 is a schematic sectional view showing the overall construction of a sensor device (detection device) according to a first embodiment of the present invention.
Figure 2:
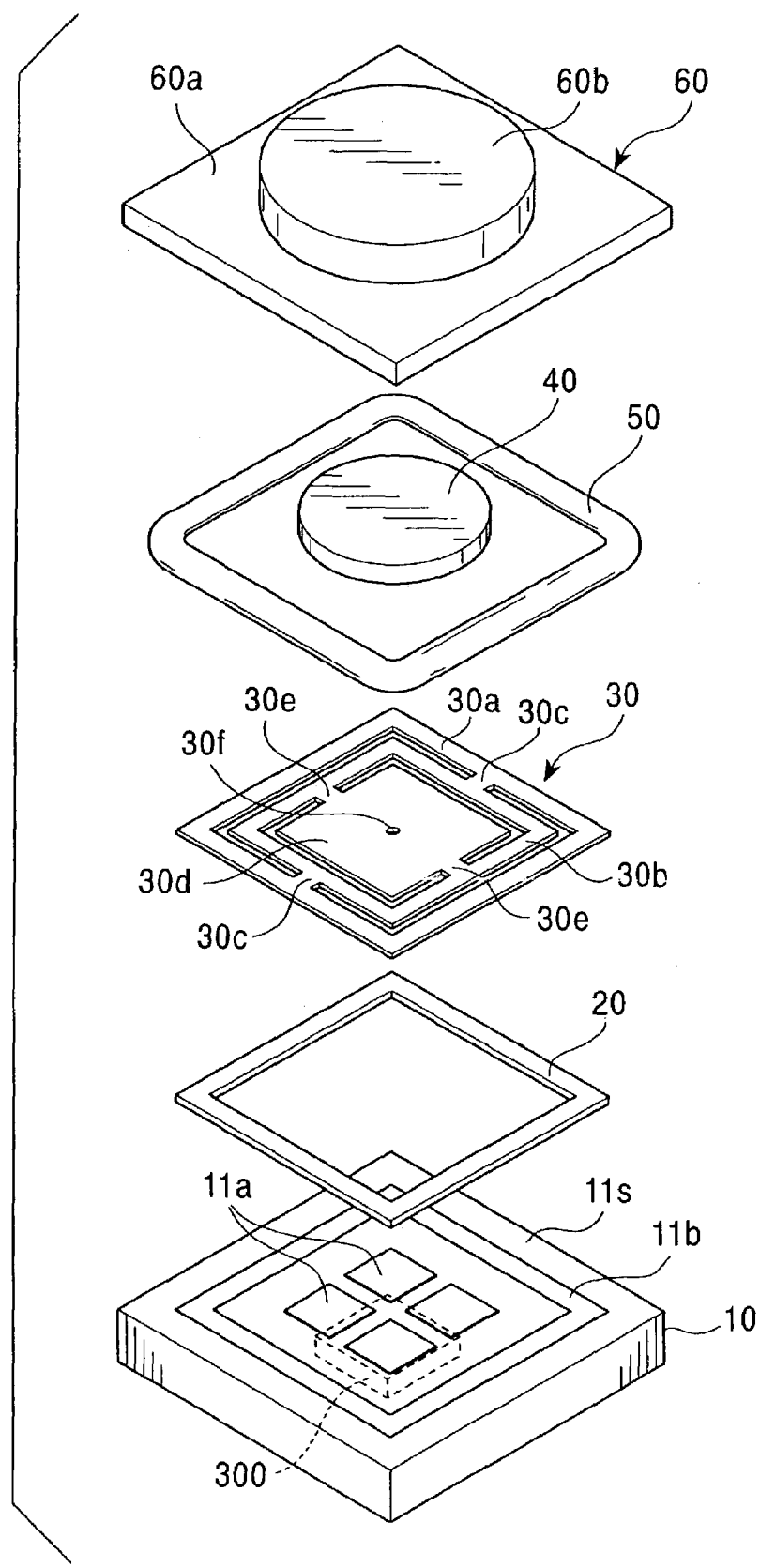
FIG. 2 is an exploded perspective view showing the overall construction of the sensor device according to the first embodiment of the present invention.

A first embodiment will be described below. FIGS. 1 to 7 show the construction of a sensor device according to a first embodiment of the present invention. FIG. 1 is a schematic sectional view showing the overall construction of the sensor device, FIG. 2 is an exploded perspective view of the sensor device, and FIGS. 3 to 7 are sectional plan views of a board showing the construction of the main part of the sensor device.

With reference to FIG. 1, a sensor device (detection device) 100 according to the present embodiment includes a detector unit 200 for detecting electrical signals on a top surface 11S of a board 10 and a circuit component 300 which processes the electrical signals detected by the detector unit 200 on a bottom surface 13R of the board 10. In the present embodiment, the detector unit 200 is constructed as a capacitive tilt sensor, and a bare integrated circuit (IC) chip is used as the circuit component 300.

The detector unit 200 is a capacitive tilt sensor which detects the tilt of the sensor device 100 as capacitance changes. As shown in FIG. 2, the detector unit 200 includes four detection electrodes 11a formed on the top surface 11S of the board 10, a metal plate (counter electrode) 30 which faces the detection electrodes 11a, and a weight 40 which serves to twist the metal plate 30.

The detection electrodes 11a are arranged in a matrix pattern at the central region of the top surface 11S of the board 10, and an electrode 11b having a rectangular frame shape is disposed at the peripheral region of the top surface 11S in such a manner that the electrode 11b surrounds the four detection electrodes 11a. A conductive spacer 20 which is composed of a metal and has a rectangular fame shape is disposed on the electrode 11b, and the metal plate 30 is laminated on the spacer 20. A constant gap whose size corresponds to the thickness of the spacer 20 is maintained between the metal plate 30 and the detection electrodes 11a. Thus, four variable capacitors for signal detection are constructed of the metal plate 30 and the four detection electrodes 11a.

The metal plate 30 includes a frame-shaped retaining portion 30a at the periphery region thereof, an intermediate portion 30b which is retained by the retaining portion 30a in such a manner that the intermediate portion 30b can rotate around first axial portions 30c, and a conductive mounting portion 30d which is retained by the intermediate portion 30b in such a manner that the mounting portion 30d can rotate around second axial portions 30e which extend perpendicularly to the first axial portions 30c. Accordingly, the mounting portion 30d can rotate around two axes when the axial portions 30c and 30e are twisted.

More specifically, the retaining portion 30a is placed on the spacer 20, and the first axial portions 30c are formed such that they extend inward from the inner periphery of the retaining portion 30a at the centers of two opposing sides of the retaining portion 30a. The inner ends of the first axial portions 30c are connected to the frame-shaped intermediate portion 30b which extends along the inner periphery of the retaining portion 30a. Accordingly, the intermediate portion 30b can rotate around the axial line of the first axial portions 30c when the device tilts and the first axial portions 30c are twisted.

The second axial portions 30e are formed such that they extend perpendicularly to the first axial portions 30c from the inner periphery of the intermediate portion 30b at positions such that they oppose each other. The inner ends of the second axial portions 30e are connected to the mounting portion 30d whose outer periphery extends along the inner periphery of the intermediate portion 30b. Accordingly, the mounting portion 30d can rotate around the axial line of the second axial portions 30e when the second axial portions 30e are twisted.

The axial directions of the axial portions 30c and 30e correspond to the row direction and the column direction of the matrix pattern in which the detection electrodes 11a are arranged. Thus, the rotation of the mounting portion 30d can be detected with high sensitivity.

The metal plate 30 can be manufactured by, for example, forming grooves having a bracket shape (approximate 'U' shape) in a plan view in a thin metal plate composed of a stainless steel or the like at positions between the retaining portion 30a and the intermediate portion 30b and between the intermediate portion 30b and the mounting portion 30d. Thus, the metal plate 30 can be easily manufactured with high accuracy.

The weight 40 is adhered to the mounting portion 30d, and a projection 40b which extends toward the top surface 11S of the board 10 and whose length is approximately the same as the total thickness of the spacer 20 and the metal plate 30 is formed on the bottom surface of the weight 40. The projection 40b extends through a central hole 30f formed in the mounting portion 30d at a position corresponding to the projection 40b, and is in contact with the top surface 11S of the board 10 at the central position of the four detection electrodes 11a. Accordingly, the weight 40 can rotate around the contact point in accordance with the tilt of the sensor device 100 and applies a predetermined moment around one or both of the axial lines of the axial portions 30c and the axial portions 30e.

When one or both of the axial portions 30e and 30c are twisted by this moment, the mounting portion 30d rotates and stops at an angle such that this moment and the torsional restoring force of the axial portions 30c and 30e are balanced.

The weight 40 includes a head portion (top portion), which is the main body, and a bottom portion 40a which is thinner than the head portion, so that the gravity center of the weight 40 is at a relatively high position. Accordingly, a small tilt of the sensor device 100 causes a large moment around the above-described axial lines, and the sensitivity to tilt of the sensor device 100 can be increased while reducing the weight thereof.

A metal cover 60 is disposed on the top surface 11S of the board 10 with a packing 50 therebetween, the packing 50 having a rectangular frame shape and extending along the outer periphery of the top surface 11S. The metal cover 60 includes a cylindrical head portion 60b and a flange portion 60a which extends outward from the head portion 60b. The flange portion 60a pushes the retaining portion 30a downward so as to fix it, and is grounded by suitable means.

Accordingly, the sensor device 100 is protected from dust, moisture, external charged objects which may cause capacitance drift, noise, careless handling, etc. An insulating coating (not shown) is applied to the inner surface of the metal cover 60, so that the metal cover 60 can be prevented from being electrically connected to the metal plate 30.

The shape of the metal cover 60 is symmetric about the central axis of the mounting portion 30d, so that offset capacitances are not provided between the mounting portion 30d and the detection electrodes 11a.

The board 10 is a multilayer wiring board formed by laminating insulating plates 11 to 14 composed of ceramic material, epoxy resin, or the like. Top surfaces 11S to 13S of the plates 11 to 13 and bottom surfaces 13R and 14R of the plates 13 and 14 serve as a detection electrode layer, a ground layer, a power supply layer, a chip mounting surface, and a connection electrode surface, respectively.

Figure 3:
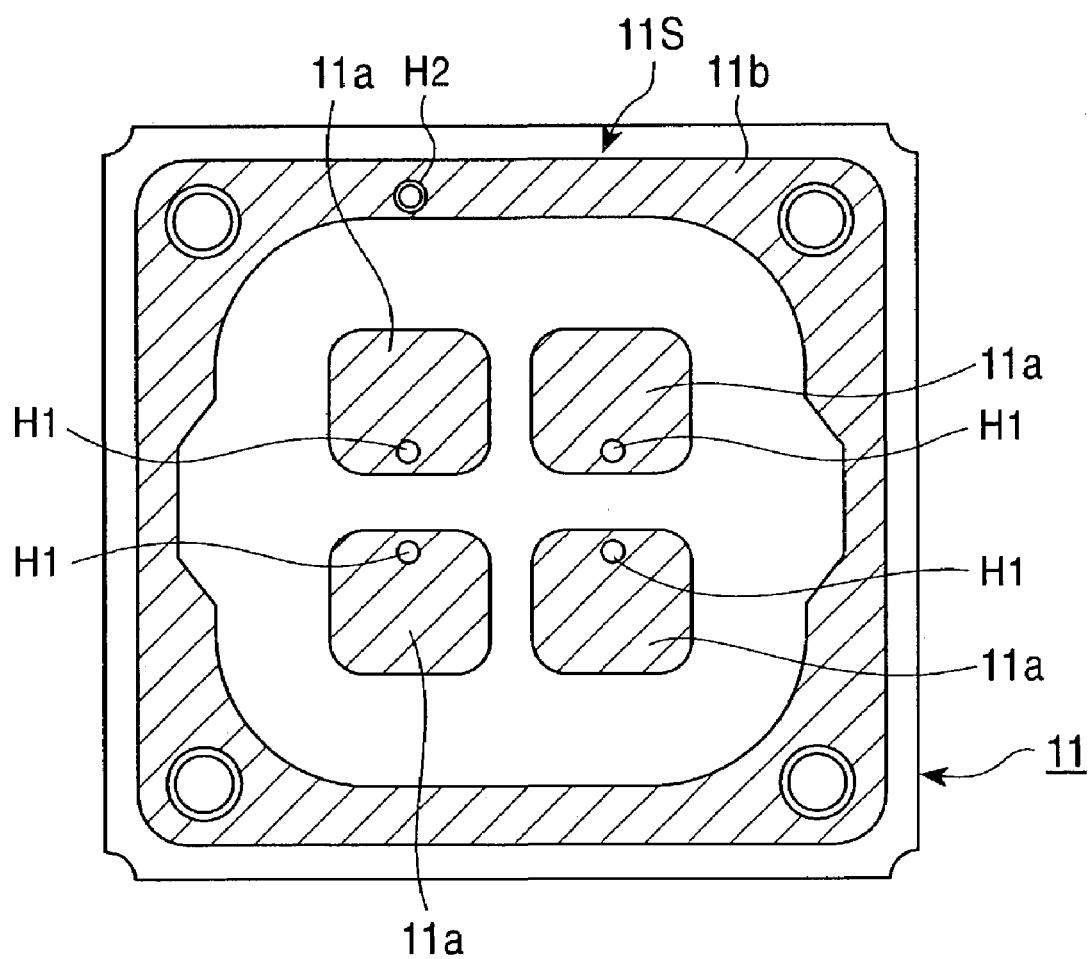
FIG. 3 is a sectional plan view showing the construction of a board included in the sensor device according to the first embodiment of the present invention (a plan view of a plate)

As shown in FIG. 3, the four detection electrodes 11a are formed in a matrix pattern at the central region of the detection electrode layer 11S, that is, the top surface of the board 10 (or the top surface of the plate 11) by, for example, printing a silver (Ag) pattern. In addition, the electrode 11b having a rectangular frame shape is formed at the peripheral region of the detection electrode layer 11S, and is electrically connected to the metal plate 30.

The detection electrodes 11a and the electrode 11b are respectively connected to terminals 13a and 13b on the chip mounting surface 13R with through-hole electrodes H1 and H2 which extend from the detection electrode layer 11S to the chip mounting surface 13R (see FIGS. 3 to 6). The through-hole electrodes H1 and H2 are constructed by forming thin holes by laser processing or press working, filling the holes with silver paste by screen printing, and baking the silver paste. Thus, the electrodes 11a and 11b are respectively connected to the terminals 13a and 13b via the through-hole electrodes H1 and H2 over approximately the shortest distance. Accordingly, electrical signals including detection signals and a drive signal can be transmitted to/from the circuit component 300 without being substantially affected by electrostatic disturbances.

Figure 4:
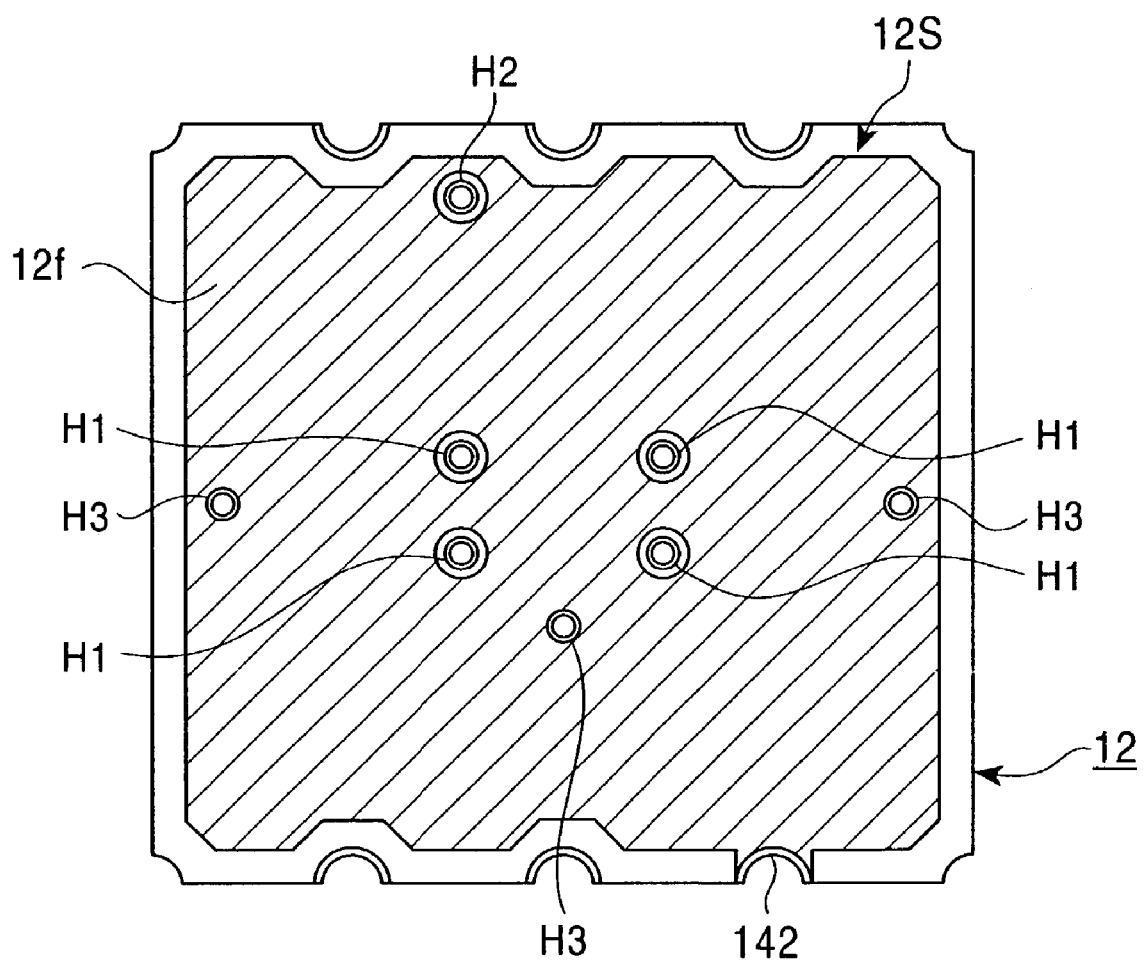
FIG. 4 is a sectional plan view showing the construction of the board included in the sensor device according to the first embodiment of the present invention (a plan view of another plate)

The ground layer 12S prevents the drive signal from the metal plate 30 from being input to the circuit component 300 without passing through the detection electrodes 11a. In addition, the ground layer 12S serves as a noise shield which prevents noise from entering through the board 10. More specifically, the ground layer 12S prevents noise from reaching the detector unit 200 from the bottom side of the board 10, and from reaching the circuit component 300 from the top side of the board 10. As shown in FIG. 4, approximately the entire region of the ground layer 12S excluding the through-hole electrodes H1 and H2 and the peripheral region of the plate 12 is constructed as a metal surface (conductive surface) 12f composed of, for example, silver (Ag). The metal surface 12f is electrically connected to a metal surface (conductive surface) 13f on the chip mounting surface 13R with a plurality of through-hole electrodes H3 which extend from the ground layer 12S shown in FIG. 4 to the chip mounting surface 13R shown in FIG. 6, and is connected to a terminal 13d. In addition, the metal surface 12f is grounded via a lead electrode 142 formed on a side surface of the board 10 (see FIG. 6). A plurality of through-hole electrodes H3 are provided in order to make the ground potential of the metal surface 12f, which serves as a ground pattern, uniform.

In order to prevent capacitive coupling with the signal-detection capacitors constructed of the metal plate 30 and the detection electrodes 11a, the ground layer 12S and the detection electrode layer 11S are sufficiently separated from each other. For example, the plate 11 has the thickness of, for example, about 0.4 mm. The thickness of the plate 11 is preferably 0.3 mm or more, and capacitive coupling with the detector unit 200 can be effectively prevented in such a case.

Figure 5:
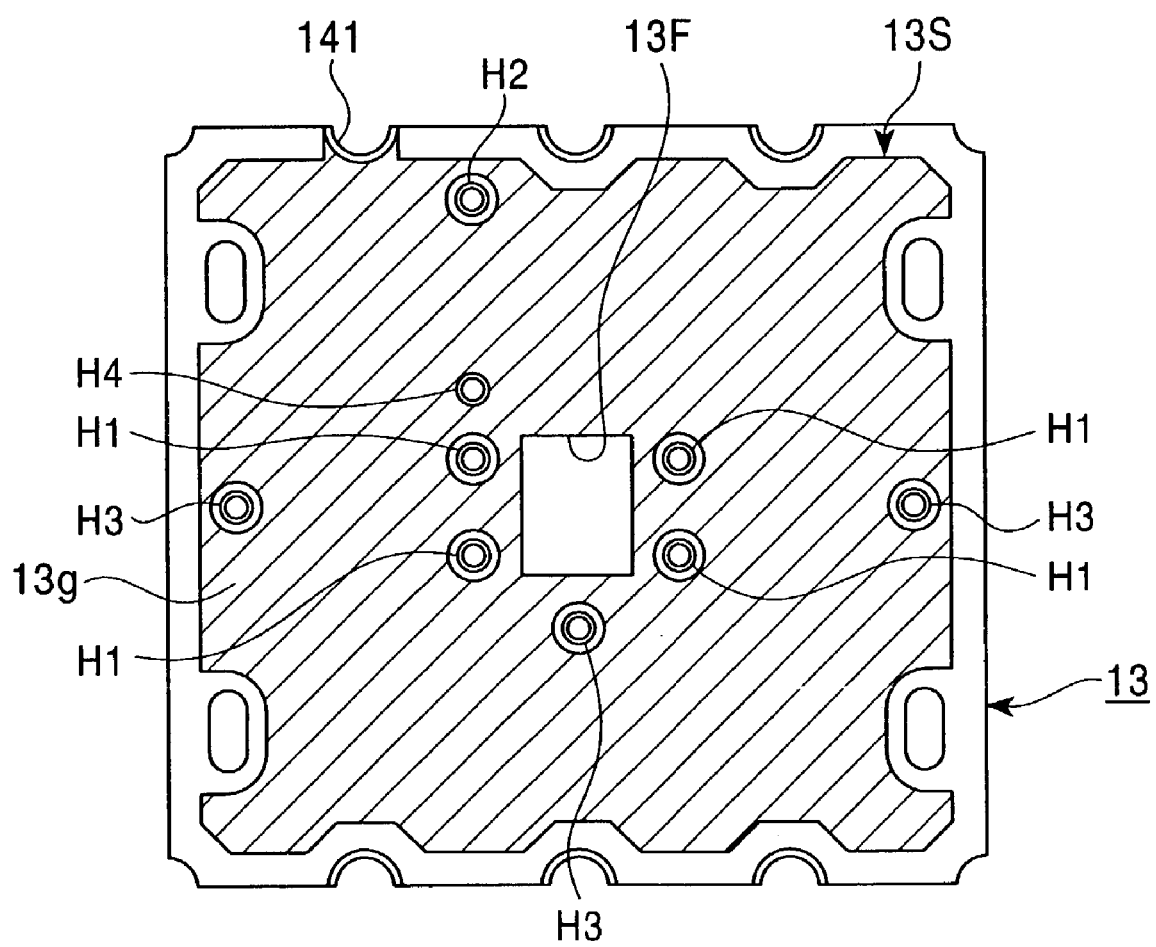
FIG. 5 is a sectional plan view showing the construction of the board included in the sensor device according to the first embodiment of the present invention (a plan view of another plate)

The power supply layer 13S and the ground layer 12S serve as a bypass capacitor. As shown in FIG. 5, approximately the entire region of the power supply layer 13S excluding the through-hole electrodes H1 to H3 and the peripheral region of the plate 13 is constructed as a metal surface (conductive surface) 13g composed of, for example, silver (Ag). The metal surface 13g is connected to a terminal 13c on the chip mounting surface 13R with a through-hole electrode H4 which extends from the power supply layer 13S to the chip mounting surface 13R (see FIG. 6). In addition, the potential of the metal surface 13g is set to a power supply potential by being connected to a lead electrode 141 formed on a side surface of the board 10.

The ground layer 12S is closer to the power supply layer 13S than to the top surface (detection electrode layer) 11S of the board 10, and the power supply layer 13S and the ground layer 12S are disposed in proximity of each other. For example, a thin plate having the thickness of about 0.1 mm is used as the plate 12. Accordingly, a bypass capacitor is constructed of the ground layer 12S and the power supply layer 13S, so that it is not necessary to use an additional capacitor. Thus, the structure of the sensor device 100 can be made simpler. The thickness of the plate 12 is preferably 0.2 mm or less, and functions of a bypass capacitor can be reliably obtained in such a case.

In addition, in order to prevent capacitive coupling between the power supply layer 13S, which is more easily affected by noise compared to the ground layer 12S, and the circuit component 300, the metal surface 13g includes an open area 13F in which the metal pattern is not formed at the central region corresponding to the position where the circuit component 300 is disposed.

Figure 6:
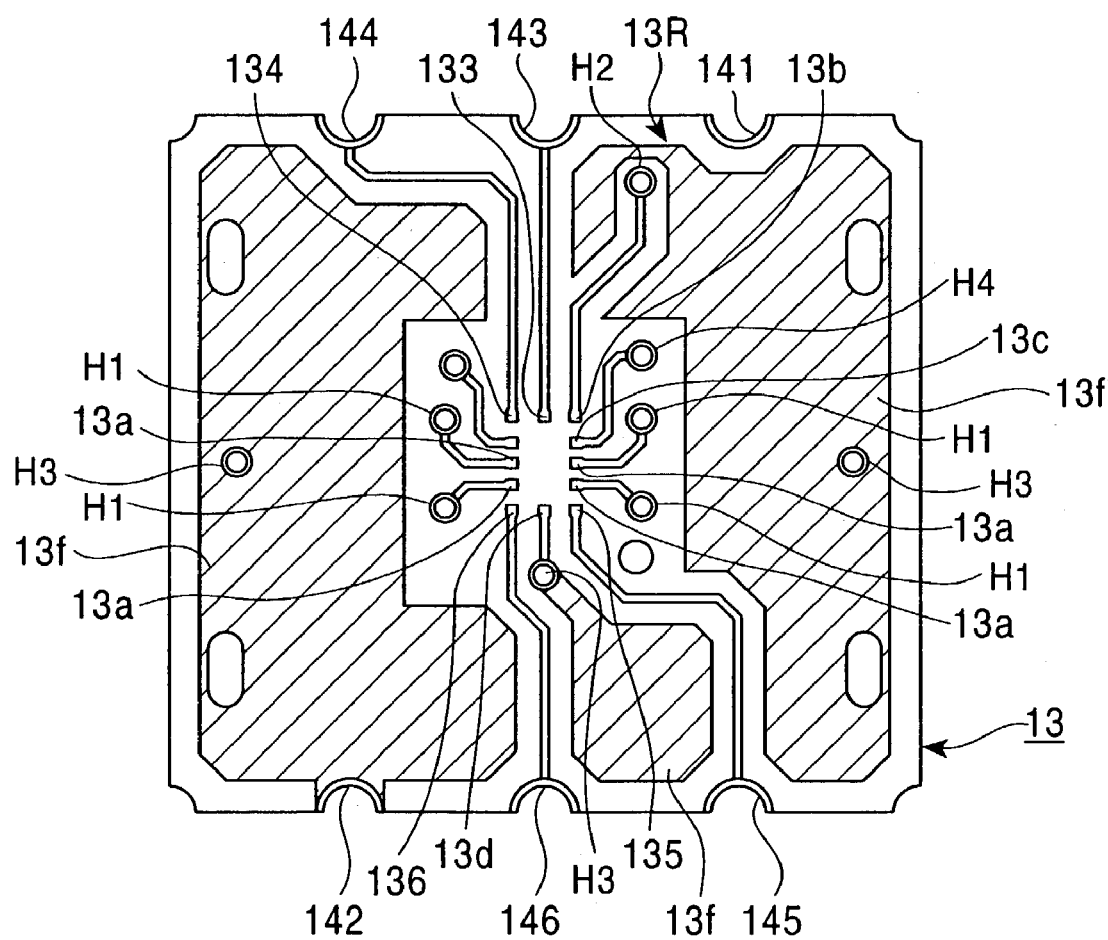
FIG. 6 is a sectional plan view showing the construction of the board included in the sensor device according to the first embodiment of the present invention (a rear view of the plate shown in FIG. 5)

As shown in FIG. 6, short electric lines which serve as signal lines between the detector unit 200 and the circuit component 300 and connect the through-hole electrodes H1 and H2 to the terminals (pads) 13a and 13b, respectively, are formed on the chip mounting surface 13R. In addition, electric lines which serve as output lines from the circuit component 300 to an external device (not shown) and connect terminals (pads) 133 to 136 to lead electrodes 143 to 146, respectively, are also formed on the chip mounting surface 13R. In addition, in order to block external noise, the grounded metal surface 13f composed of, for example, silver (Ag), is formed at regions excluding the through-hole electrodes H1 to H4 and the electric lines connected thereto.

In order to prevent capacitive coupling with the bypass capacitor constructed of the power supply layer 13S and the ground layer 12S, the power supply layer 13S and the chip mounting surface 13R are sufficiently separated from each other. For example, the plate 13 has the thickness of, for example, about 0.2 mm. The thickness of the plate 13 is preferably 0.15 mm or more, and capacitive coupling between the circuit component 300 and the detector unit 200 or between the circuit component 300 and the above-described bypass capacitor can be effectively prevented in such a case.

Figure 7:
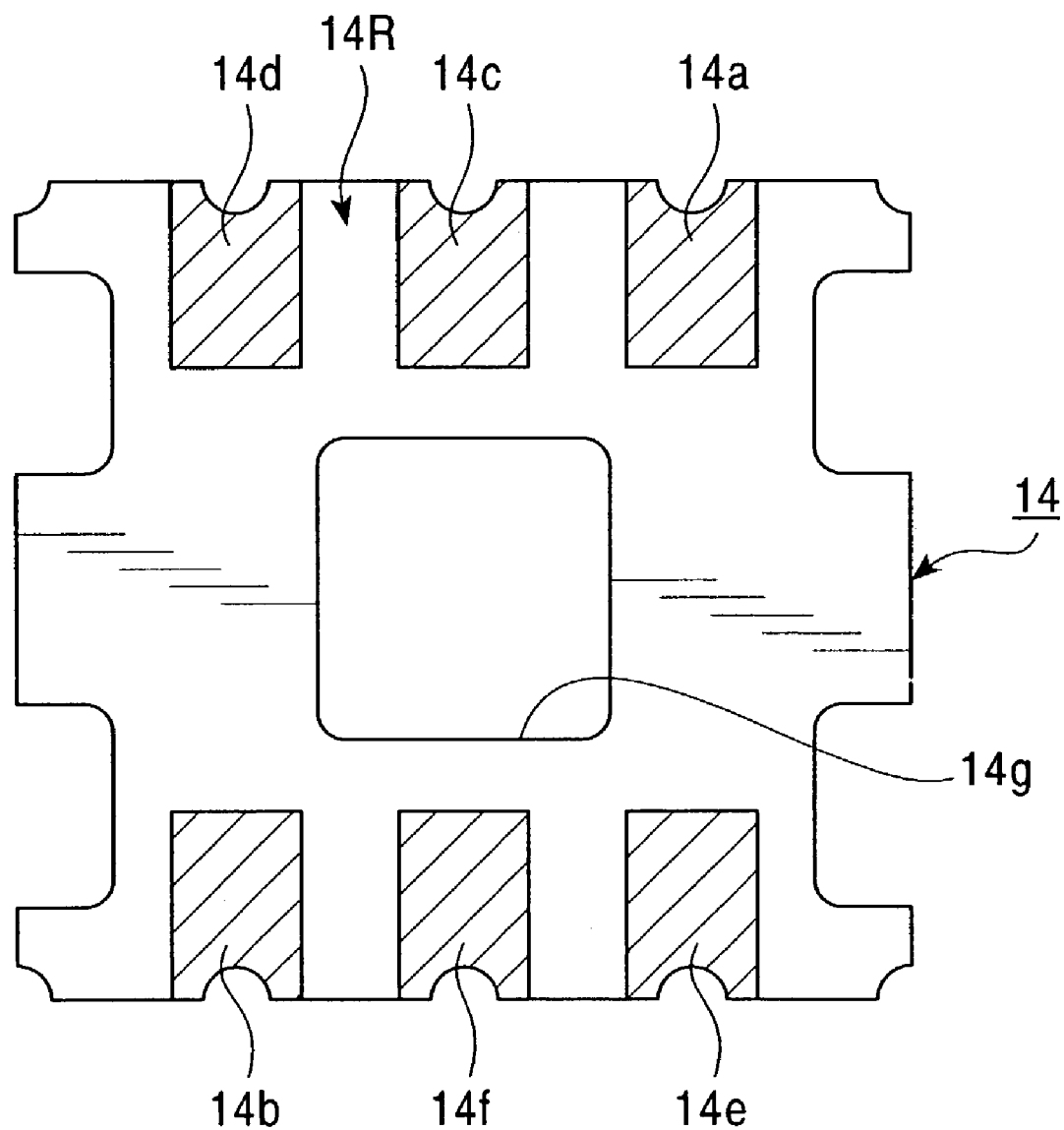
FIG. 7 is a sectional plan view showing the construction of the board included in the sensor device according to the first embodiment of the present invention (a rear view of another plate)

As shown in FIG. 7, six external connection electrodes 14a to 14f are formed on the connection electrode surface 14R and are respectively connected to lead electrodes 141 to 146 formed on the side surfaces of the board 10. By soldering the connection electrode surface 14R on an external printed circuit board (PCB), the detection device 100 can be connected to an external device (not shown) via the external connection electrodes 14a to 14f. The ground layer 12S (the metal surface 12f which serves as the ground pattern) is grounded via the external connection electrode 14b, and electrical power is supplied to the power supply layer 13S (metal surface 13g) from the external device via the external connection electrode 14a. In addition, a processing result obtained by the circuit component 300 is output to the external device via the external connection electrodes 14c to 14f.

The plate 14 has an opening 14g for receiving the circuit component 300 at the central region thereof, and the thickness of the plate 14 is set such that the connection electrode surface 14R can be surface-mounted on the printed circuit board (PCB), that is, such that the circuit component 300 does not protrude from the connection electrode surface 14R.

The circuit component 300 is mounted on the chip mounting surface 13R at the bottom of the board 10, and the terminals 13a and 13b for signal detection, the terminal 13c for power supply, the terminal 13d for grounding, and the terminals 133 to 136 for signal output, all of which are formed on the chip mounting surface 13R, are connected to their respective aluminum terminals 300a of the circuit component 300 with gold bumps 310. The drive signal is applied to the metal plate 30 via the terminal 13b for driving, and electrical signals such as voltages detected by the detection electrodes 11a, which are arranged so as to face the metal plate 30, are input to the circuit component 300 via the terminals 13a for detection. The capacitance changes in the signal-detection capacitors are determined on the basis of the thus obtained electrical signals.

Four signal-detection capacitors are constructed of the metal plate 30 and the detection electrodes 11a, and the direction and amount of tilt of the sensor device 100 are calculated on the basis of the capacitance changes in these four capacitors. The calculation results are output to the external device via the terminals 133 to 136 for signal output and the external connection electrodes 14c to 14f.

The terminals (pads) 13a to 13d and 133 to 136 and the terminals 300a are preferably coated with gold in order to improve their bondability.

In the present embodiment, the circuit component 300 is a bare integrated circuit chip. This bare chip is constructed by forming a circuit unit 300c called a diffusion layer on a substrate 300b composed of a semiconductor material such as silicon (semiconductor substrate) at the central region thereof by thermal diffusion method, ion implantation method, etc. Approximately the entire region of a surface of the bare chip (circuit component) 300 including the circuit unit (diffusion layer) 300c (that is, the top surface in FIG. 1) is covered with an insulating film (not shown) composed of silicon dioxide ($SiO_2$). A plurality of aluminum (Al) patterns (not shown) are formed on the insulating film, and are electrically connected to their respective terminals 300a at one end thereof. In addition, a plurality of small through holes are formed in the insulating film at predetermined positions above the circuit unit 300c, and the above-described Al patterns are connected to predetermined portions of the circuit unit 300c via these through holes.

One of the Al patterns which is electrically connected to the terminal 300a which is connected to the terminal (pad) 13d for grounding by bump bonding is connected to the substrate 300b via a small hole (not shown) formed in the insulating film on the substrate 300b. Accordingly, the substrate 300b is electrically connected to the metal surface 12f (ground layer), which serves as the ground pattern of the board 10, via the Al pattern, the terminal 300a for grounding, the gold bump 310, the pad 13d, the through-hole electrode H3, etc. Since the circuit unit 300c is surrounded by the grounded substrate 300b at the bottom and sides thereof and the ground layer 12S is disposed above the circuit unit 300c, the circuit unit 300c is almost completely shielded and is hardly affected by external noise.

In addition, for the purpose of reinforcing, the circuit component (bare chip) 300 is bonded to the chip mounting surface 13R with an insulating resin 320 such as epoxy resin. More specifically, the chip mounting surface 13R on which the circuit component 300 is not yet mounted is made to face upward, and the liquid epoxy resin 320 is poured on the chip mounting surface 13R at a region surrounded by the pads with a dispenser or the like. Then, the circuit component 300 is placed on the chip mounting surface 13R at a predetermined position such that the circuit unit 300c of the circuit component 300 faces the board 10. At this time, the epoxy resin 320 spreads beyond the region surrounded by the gold bumps 310 due to its fluidity. Then, an ultrasonic wave is applied from the back of the circuit component 300, so that the pads 13a to 13d and 133 to 136 are bonded to their respective terminals 300a of the circuit component 300 with the gold bumps 310 by ultrasonic bonding. Then, the epoxy resin 320 is thermally cured so that the circuit component 300 is bonded on the chip mounting surface 13R.

The resin 320 spreads beyond the terminals 300a and serves to protect the bonding areas and the terminals 300a from corrosion and the like. Although the entire region of the circuit component 300 may be covered with the resin 320, this is not necessary since the substrate 300b is grounded.

The sensor device 100 according to the first embodiment of the present invention is constructed as described above, and when the sensor device 100 is tilted, the weight 40 rotates around the contact point between the projection 40b and the board 10 and applies a moment around one or both of axial portions 30c and the axial portions 30e to the mounting portion 30d in accordance with the direction and amount of tilt. The mounting portion 30d stops at an angle such that this moment and the torsional restoring force of the axial portions 30c and 30e are balanced.

Accordingly, the capacitances of the signal-detection capacitors constructed of the mounting portion 30d and the detection electrodes 11a change, and electrical signals representing the capacitance changes are input to the circuit component 300, which is mounted at a position approximately directly below the detection electrodes 11a, via the through-hole electrodes H1 and H2 and the terminals 13a and 13b. The processing result obtained by the circuit component 300 is output to the external device via the external connection electrode 14c to 14f on the connection electrode surface 14R.

According to the sensor device 100 of the present embodiment, the detector unit 200 is provided on the top surface 11S of the board 10, and the circuit component 300 is mounted on the bottom surface 13R of the board 10. Thus, the detector unit 200 and the circuit component 300 are combined together with the board 10 therebetween, so that the structure of the sensor device 100 can be made simpler and the manufacturing costs can be reduced. In addition, since the detector unit 200 is connected to the circuit component 300 via the through-hole electrodes H1 and H2 which penetrate through the board 10 in the thickness direction thereof, the signals detected by the detector unit 200 can be input to the circuit component 300 over approximately the shortest distance. Therefore, the influence of external noise during signal transmission and cross-talk between internal signals can be minimized and the detection accuracy can be significantly improved.

In addition, since the circuit component 300 is mounted at a position such that the circuit component 300 faces the detection electrodes 11a across the board 10, the lengths of the electric lines from the through-hole electrodes H1 and H2 to the terminals 13a and 13b, respectively, can be reduced, so that the detection accuracy can be further improved. Furthermore, when the lengths of the electric lines are reduced, the parasitic capacitances of the electric lines can also be reduced and the detection accuracy can be further improved.

In addition, since the ground layer 12S is included in the board 10 and is grounded via the through-hole electrodes H3, the detector unit 200 can be shielded from external noise from the bottom side of the board 10 and the circuit component 300 can be shielded from external noise from the top side of the board 10. Since the thickness of the plate 11 is set to 0.3 mm or more so that the detection electrodes 11a are separated from the ground layer 12S by 0.3 mm or more, the ground layer 12S and the detection electrode layer 11S are sufficiently separated from each other. Accordingly, capacitive coupling with the signal-detection capacitors can be prevented and the detection accuracy can be further improved.

Furthermore, since the thickness of the plate 12 is set to 0.2 mm or less so that the ground layer 12S and the power supply layer 13S are placed within 0.2 mm from each other, a bypass capacitor is constructed between the ground layer 12S and the power supply layer 13S. Accordingly, it is not necessary to use an additional capacitor and the structure of the sensor device 100 can be made simpler.

In addition, since the thickness of the plate 13 is set to 0.15 mm or more so that the power supply layer 13S and the chip mounting surface 13R are separated from each other by 0.15 mm ore more, capacitive coupling between the circuit component 300 and the above-described bypass capacitor (power supply layer 13S) can be prevented.

In addition, since the sensor device (detection device) 100 according to the first embodiment of the present invention includes a bare integrated circuit chip as the circuit component 300, the size and weight of the sensor device 100 can be reduced. In addition, the bare chip 300 is connected to the board 10 by bump bonding such that the circuit unit (diffusion unit) 300c faces the bottom surface of the board 10. Accordingly, the parasitic capacitances of wires are not generated as in the case in which the bare chip 300 is connected to the board 10 by wire bonding, and the detection accuracy can be further improved. Furthermore, the insulating resin used for reinforcement and protection is only required to cover the bonding surfaces between the board 10 and the bare chip and the regions around the terminals. Therefore, the amount of the insulating resin used can be reduced and the thickness of the device can be reduced.

In addition, the substrate 300b of the bare chip is grounded by being electrically connected to the metal surface 12f which serves as the ground pattern, and the circuit unit 300c is disposed between the thus grounded substrate 300b of the bare chip and the ground layer 12S of the board 10. Accordingly, the circuit unit 300c is almost completely shielded, and is hardly affected by the influence of external noise.

In addition, since the external connection electrodes 14a to 14f are formed on the bottom surface of the board 10, the detection device (sensor device) 100 can be handled as if it is an electrical component and be easily mounted on an external printed circuit board (PCB).

In addition, in the sensor device 100 according to the present embodiment, four detection electrodes 11a are arranged in a matrix pattern, and the mounting portion 30d can rotate around the axial portions 30c and 30e which extend along the raw direction and the column direction of the matrix pattern. Accordingly, the direction of tilt of the sensor device 100 can be determined two-dimensionally.

In addition, since the bottom portion 40a of the weight 40 has the projection 40b which is in contact with the detection electrode layer 11S, the mounting portion 30d can smoothly rotate around the contact point when the axial portions 30c and 30e are twisted. In addition, since the downward displacement of the mounting portion 30d is prevented by the projection 40b, offset capacitances due to gravity, etc., are not included in the detection signals. Furthermore, since the axial portions 30c and 30e do not directly receive the weight of the weight 40 unless the sensor device 100 is tilted by an extremely large amount, permanent deformation of the axial portions 30c and 30e do not easily occur even when the widths thereof are reduced. Accordingly, the sensitivity to tilt can be increased by reducing the widths of the axial portions 30c and 30e and increasing the amount of twist with respect to the moment around the axial lines.

Next, a second embodiment of the present invention will be described below with reference to FIGS. 8 and 9. Components similar to those described above with reference to FIGS. 1 to 7 in the first embodiment are denoted by the same reference numerals, and explanations thereof are thus omitted.

Figure 8:
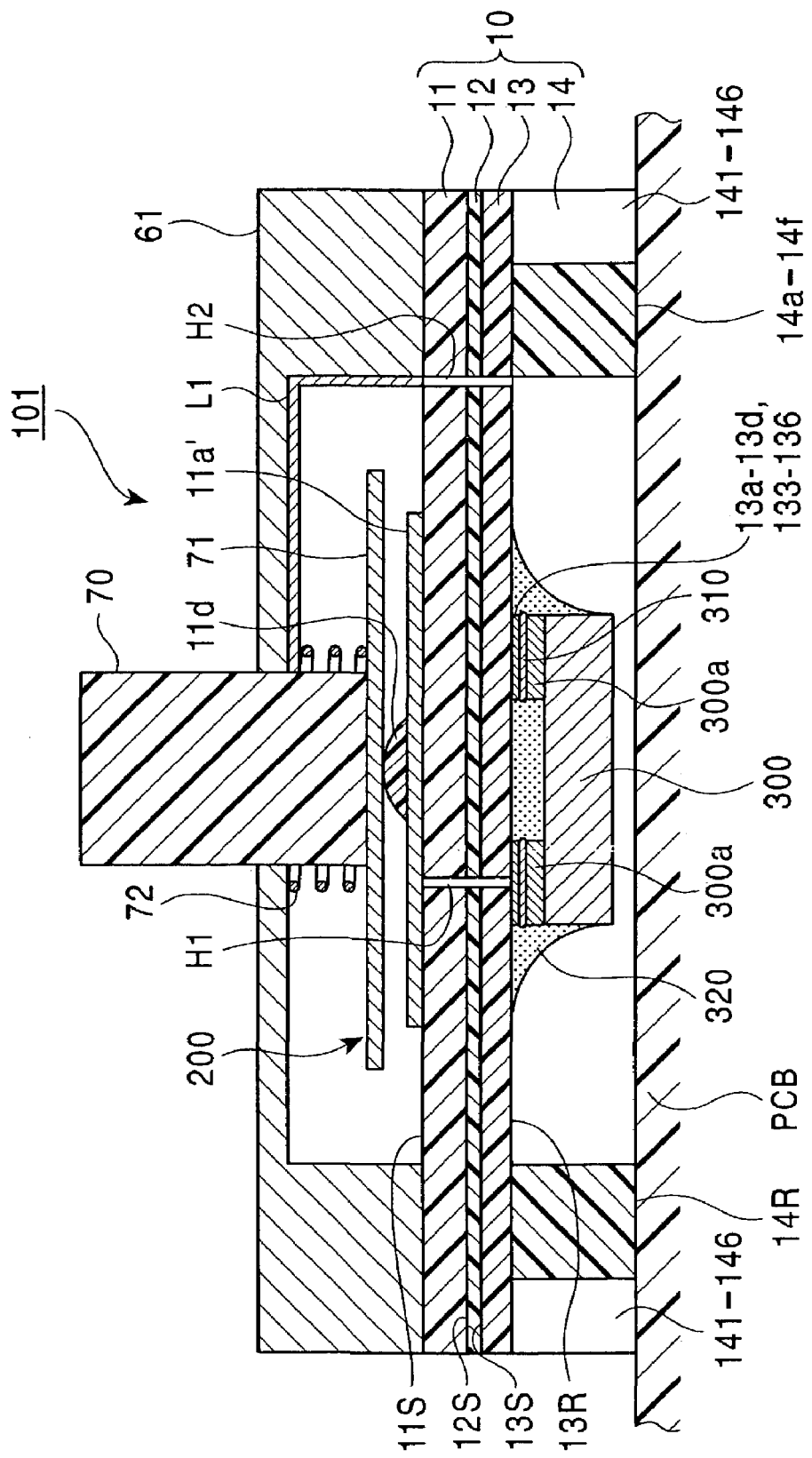
FIG. 8 is a schematic sectional view showing the overall construction of a sensor device according to a second embodiment of the present invention.

As shown in FIG. 8, a sensor device (detection device) 101 according to the present embodiment includes a detector unit 201 which serves as a rotational angle sensor on a detection electrode layer 11S at the top side of a board 10 and a circuit component (bare chip) 300 which processes an electrical signal detected by the rotational angle sensor 201 on a chip mounting surface 13R at the bottom side of the board 10.

The rotational angle sensor 201 is a capacitive sensor which detects the rotational angle of an insulating columnar member (bar) 70 as a capacitance change, and includes a detection electrode 11a' formed on the top surface 11S of the board 10 and a metal plate (counter electrode) 71 which can rotate together with the bar 70.

Similarly to the first embodiment, the board 10 has a multilayer structure including plates 11 to 14, and top surfaces 11S to 13S of the plates 11 to 13 and bottom surfaces 13R and 14R of the plates 13 and 14 serve as a detection electrode layer, a ground layer, a power supply layer, a chip mounting surface, and a connection electrode surface, respectively. The ground layer 12S, the power supply layer 13S, the chip mounting surface 13R, and the connection electrode surface 14R are similar to those of the first embodiment, and explanations thereof are thus omitted.

Figure 9:
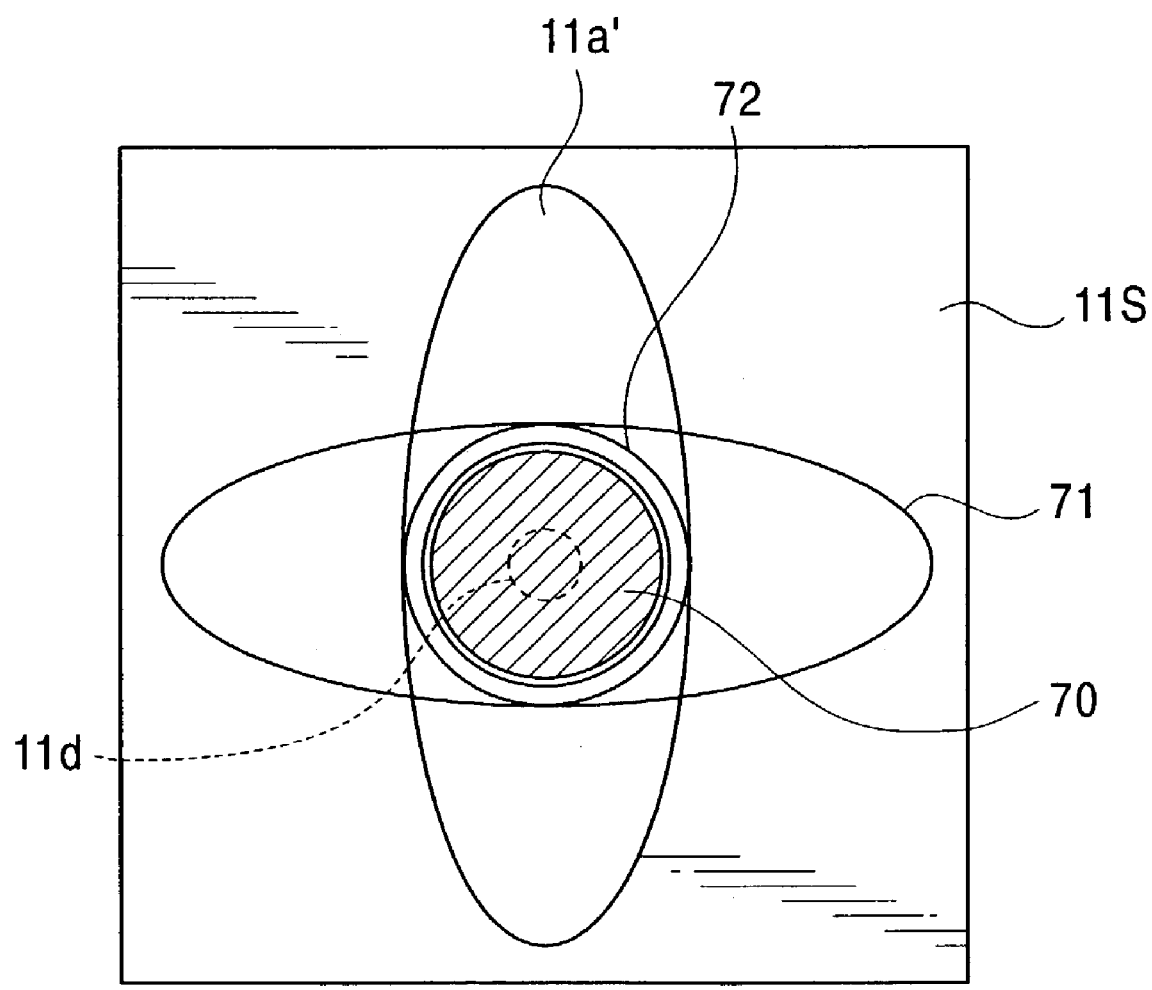
FIG. 9 is a top view (plan view) showing the construction of the main part of the sensor device according to the second embodiment of the present invention.

As shown in FIG. 9, the detection electrode 11a' has an elliptical shape and is formed on the detection electrode layer 11S at the central region thereof, and an insulating projection 11d is formed at the central region of the detection electrode 11a'. The detection electrode 11a' is connected to a terminal 13a for signal detection on the chip mounting surface 13R with a through-hole electrode H1 which extends from the detection electrode layer 11S to the chip mounting surface 13R. In order to accurately detect a small capacitance change, the detection electrode 11a' is formed by, for example, printing a silver (Ag) pattern.

A metal cover 61 is adhered to the detection electrode layer 11S, and an insulating coating is applied to the inner surface of the cover 61. Accordingly, the rotational angle sensor 201 is protected from external charged objects which may cause capacitance drift, external noise, etc. In addition, a circular hole is formed at the center of the cover 61, and a bottom portion of the bar 70 is fitted into the circular hole so that the bar 70 is retained in the upright position.

The metal plate 71 is a thin plate composed of, for example, a stainless steel, and has an elliptical shape which is approximately the same as the shape of the detection electrode 11a', as shown in FIG. 9. The metal plate 71 is retained by the projection lid at the bottom side thereof, and is disposed parallel to the detection electrode 11a'. A constant gap whose size corresponds to the height of the projection lid is maintained between the metal plate 71 and the detection electrode 11a', and a signal-detection capacitor is constructed of the metal plate 71 and the detection electrode 11a'. In addition, the metal plate 71 is fixed to the bottom surface of the bar 70, and rotates together with the bar 70. Accordingly, the capacitance between the metal plate 71 and the detection electrode 11a' changes when the bar 70 rotates. For example, the capacitance increases to a maximum when the major axis of the metal plate 71 is aligned with that of the detection electrode 11a', and decreases to a minimum when the major axis of the metal plate 71 is aligned with the minor axis of the detection electrode 11a'.

A spring member 72 constructed of a metal coil spring which is wound around the bar 70 and is attached to the top surface of the metal plate 71, and the upper end of the spring member 72 is attached to the inner surface of the cover 61. Accordingly, the metal plate 71 can rotate within a predetermined range in a plane parallel to the detection electrode 11a'. In addition, a preload is applied to the spring member 72, so that the metal plate 71 is stably retained on the projection lid due to a force applied by the spring member 72.

The upper end of the spring member 72 is electrically connected to a through-hole electrode H2 which extends from the detection electrode layer 11S to the chip mounting surface 13R with a metal lead L1 formed on the inner surface of the cover 61. Accordingly, a drive signal is applied to the metal plate 71 via the spring member 72, the metal lead L1, and the through-hole electrode H2. The metal lead L1 is formed by, for example, printing a silver (Ag) pattern on the inner surface of the cover 61 to which the insulating coating is applied.

As shown in FIG. 9, the metal plate 71 and the detection electrode 11a' are constructed as elliptical electrodes which are centered on the central axis of the bar 70. When the metal plate 71 rotates in a plane parallel to the detection electrode 11a', the capacitance of the signal-detection capacitor increases or decreases in accordance with the amount of rotation. Thus, the amount of rotation of the metal plate 71 can be calculated on the basis of the capacitance change.

Similarly to the first embodiment, the circuit component 300 constructed of a bare chip is mounted at a position approximately directly below the detection electrode 11a'. Terminals 13a and 13b for signal detection, a terminal 13c for power supply, a terminal 13d for grounding, and terminals 133 to 136 for signal output, all of which are formed on the chip mounting surface 13R, are connected to their respective aluminum terminals 300a of the circuit component 300 with gold bumps 310. The capacitance change in the signal-detection capacitor is determined on the basis of an electrical signal such as a voltage of the detection electrode 11a' input from the terminal 13a for signal detection, and then the amount of rotation of the rotational angle sensor 201 is calculated on the basis of the capacitance change. The calculation result is output to an external device via the terminals 133 to 136 for signal output and external connection electrodes 14c to 14f.

The structure of the circuit component 300 and the method of attaching the circuit component 300 to the board 10 are similar to those of the first embodiment, and explanations thereof are thus omitted.

The sensor device 101 according to the second embodiment of the present invention is constructed as described above, and when the bar 70 is rotated around the axis by a handle (not shown), the capacitance of the signal-detection capacitor increases or decreases in accordance with the amount of rotation. The capacitance change is input to the circuit component 300, which is mounted at a position approximately directly below the detection electrode 11a', via the through-hole electrode H1, and the processing result obtained by the circuit component 300 is output to the external device via the external connection electrodes 14c to 14f on the connection electrode surface 14R.

Thus, similarly to the first embodiment, according to the sensor device 101 of the present embodiment, the signal representing the capacitance change can be input to the circuit component 300 over approximately the shortest distance. Accordingly, the influence of external noise can be minimized and the detection accuracy can be significantly improved.

Next, a third embodiment of the present invention will be described below with reference to FIG. 10. Components similar to those described above with reference to FIGS. 1 to 7 in the first embodiment are denoted by the same reference numerals, and explanations thereof are thus omitted.

Figure 10:
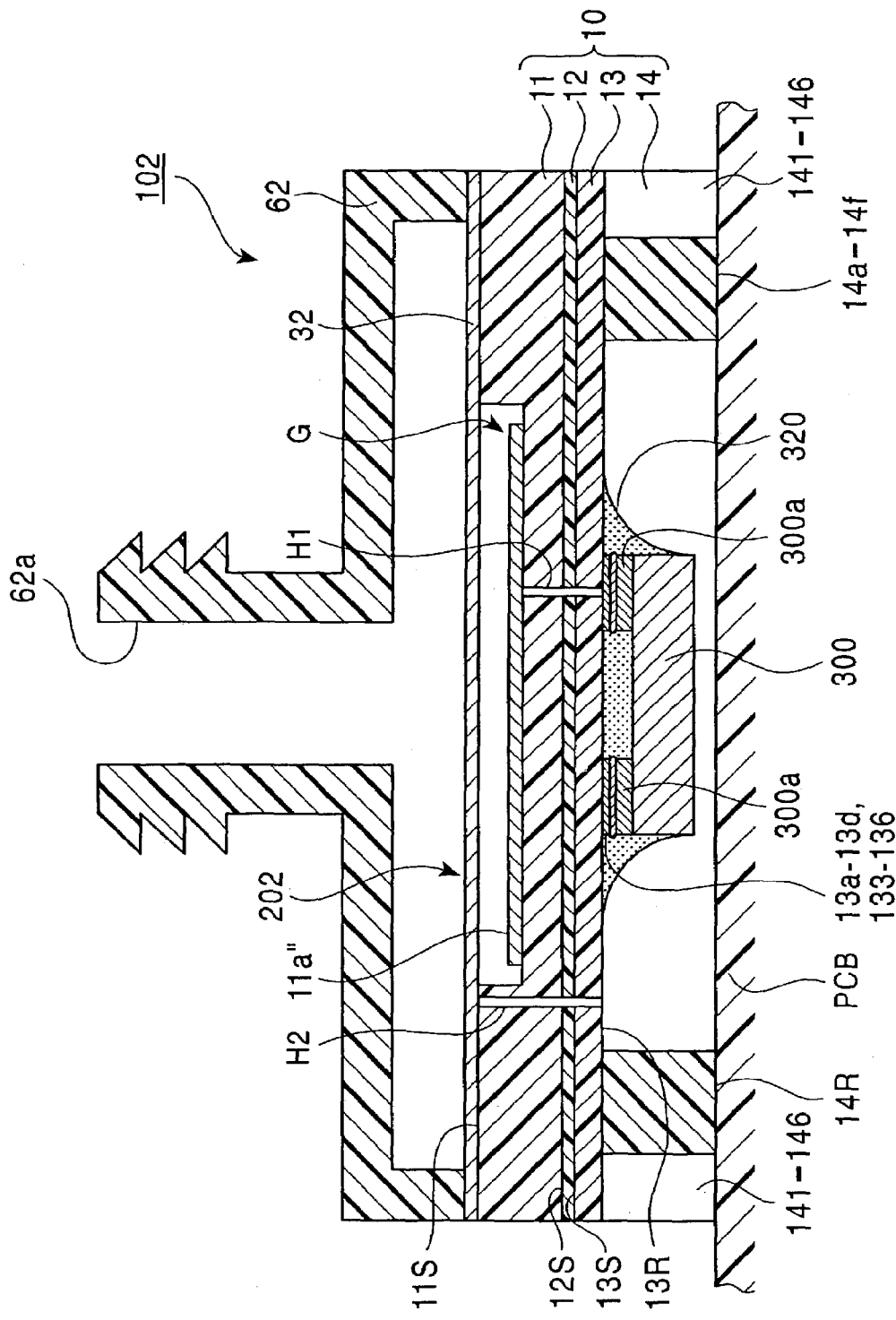
FIG. 10 is a schematic sectional view showing the overall construction of a sensor device according to a third embodiment of the present invention.

As shown in FIG. 10, a sensor device (detection device) 102 according to the present embodiment includes a detector unit 202 which serves as a pressure sensor on a detection electrode layer 11S of a board 10 and a circuit component 300 which processes an electrical signal detected by the pressure sensor 202 on the chip mounting surface 13R at the bottom side of the board 10.

Similarly to the first embodiment, the board 10 has a multilayer structure including plates 11 to 14, and top surfaces 11S to 13S of the plates 11 to 13 and bottom surfaces 13R and 14R of the plates 13 and 14 serve as a detection electrode layer, a ground layer, a power supply layer, a chip mounting surface, and a connection electrode surface, respectively. The ground layer 12S, the power supply layer 13S, the chip mounting surface 13R, and the connection electrode surface 14R are similar to those of the first embodiment, and explanations thereof are thus omitted.

The detection electrode layer 11S has a recess G which is not so deep as to extend through the plate 11 at the central region thereof, and a circular detection electrode 11a", for example, is formed on the bottom surface of the recess G by printing a silver (Ag) pattern. The detection electrode 11a" is connected to a terminal 13a for signal detection formed on the chip mounting surface 13R with a through-hole electrode H1 which extends from the bottom surface of the recess G to the chip mounting surface 13R.

A metal plate (counter electrode) 32 is adhered to the detection electrode layer 11S, and is connected to a terminal 13b with a through-hole electrode H2 which extends from the detection electrode layer 11S to the chip mounting surface 13R. The metal plate 32 is constructed of a thin plate and is elastically deformed in a direction toward/away from the detection electrode 11a" by fluid pressure, so that the capacitance of a signal-detection capacitor constructed of the metal plate 32 and the detection electrode 11a" increases or decreases.

A cover 62 is adhered to the metal plate 32. An opening 62a which serves as a fluid inlet is formed in the cover 62 at the central region thereof, so that gas or liquid can be injected into the cover 62 through the opening 62a. A fluid pressure at a position distant from the sensor device 102 can also be measured by connecting, for example, a rubber hose to the opening 62a.

Similarly to the first embodiment, the circuit component 300 constructed of a bare chip is mounted at a position approximately directly below the detection electrode 11a". Terminals 13a and 13b for signal detection, a terminal 13c for power supply, a terminal 13d for grounding, and terminals 133 to 136 for signal output, all of which are formed on the chip mounting surface 13R, are connected to their respective aluminum terminals 300a of the circuit component 300 with gold bumps 310. The capacitance change in the signal-detection capacitor is determined on the basis of an electrical signal such as a voltage of the detection electrode 11a" input from the terminal 13a for signal detection, and then the fluid pressure applied to the top surface of the metal plate 32 is calculated on the basis of the capacitance change. The calculation result is output to an external device via the terminals 133 to 136 for signal output and external connection electrodes 14c to 14f.

The structure of the circuit component 300 and the method of attaching the circuit component 300 to the board 10 are similar to those of the first embodiment, and explanations thereof are thus omitted.

The sensor device 102 according to the third embodiment of the present invention is constructed as described above, and when fluid is injected through the opening 62a, the metal plate 32 is elastically deformed due to fluid pressure and the capacitance changes. A signal representing the capacitance change is input to the circuit component 300, which is mounted at a position approximately directly below the detection electrode 11a", via the through-hole electrode H1, and the processing result obtained by the circuit component 300 is output to the external device via the external connection electrodes 14c to 14f on the connection electrode surface 14R.

Thus, similarly to the first embodiment, according to the sensor device 102 of the present embodiment, the signal representing the capacitance change can be input to the circuit component 300 over approximately the shortest distance. Accordingly, the influence of external noise can be minimized and the detection accuracy can be significantly improved.

Next, a fourth embodiment of the present invention will be described below with reference to FIGS. 11 and 12. Components similar to those described above with reference to FIGS. 1 to 7 in the first embodiment are denoted by the same reference numerals, and explanations thereof are thus omitted.

Figure 11:
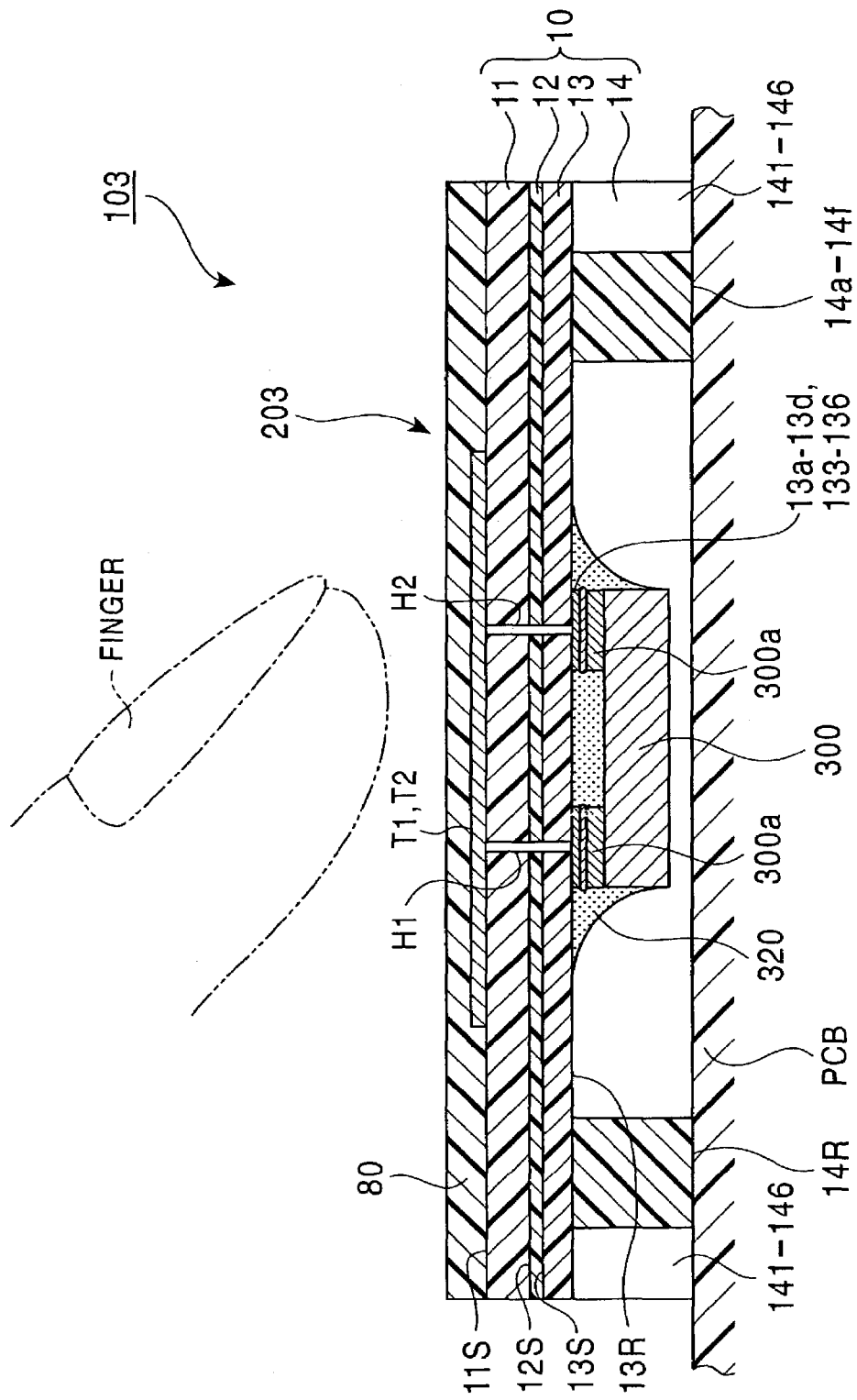
FIG. 11 is a schematic sectional view showing the overall construction of a sensor device according to a fourth embodiment of the present invention.

As shown in FIG. 11, a sensor device (detection device) 103 according to the present embodiment includes a detector unit 203 which serves as a touch sensor on a detection electrode layer 11S of a board 10 and a circuit component 300 which processes electrical signals detected by the touch sensor 203 on a chip mounting surface 13R at the bottom side of the board 10.

Similarly to the first embodiment, the board 10 has a multilayer structure including plates 11 to 14, and top surfaces 11S to 13S of the plates 11 to 13 and bottom surfaces 13R and 14R of the plates 13 and 14 serve as a detection electrode layer, a ground layer, a power supply layer, a chip mounting surface, and a connection electrode surface, respectively. The ground layer 12S, the power supply layer 13S, the chip mounting surface 13R, and the connection electrode surface 14R are similar to those of the first embodiment, and explanations thereof are thus omitted.

Figure 12:
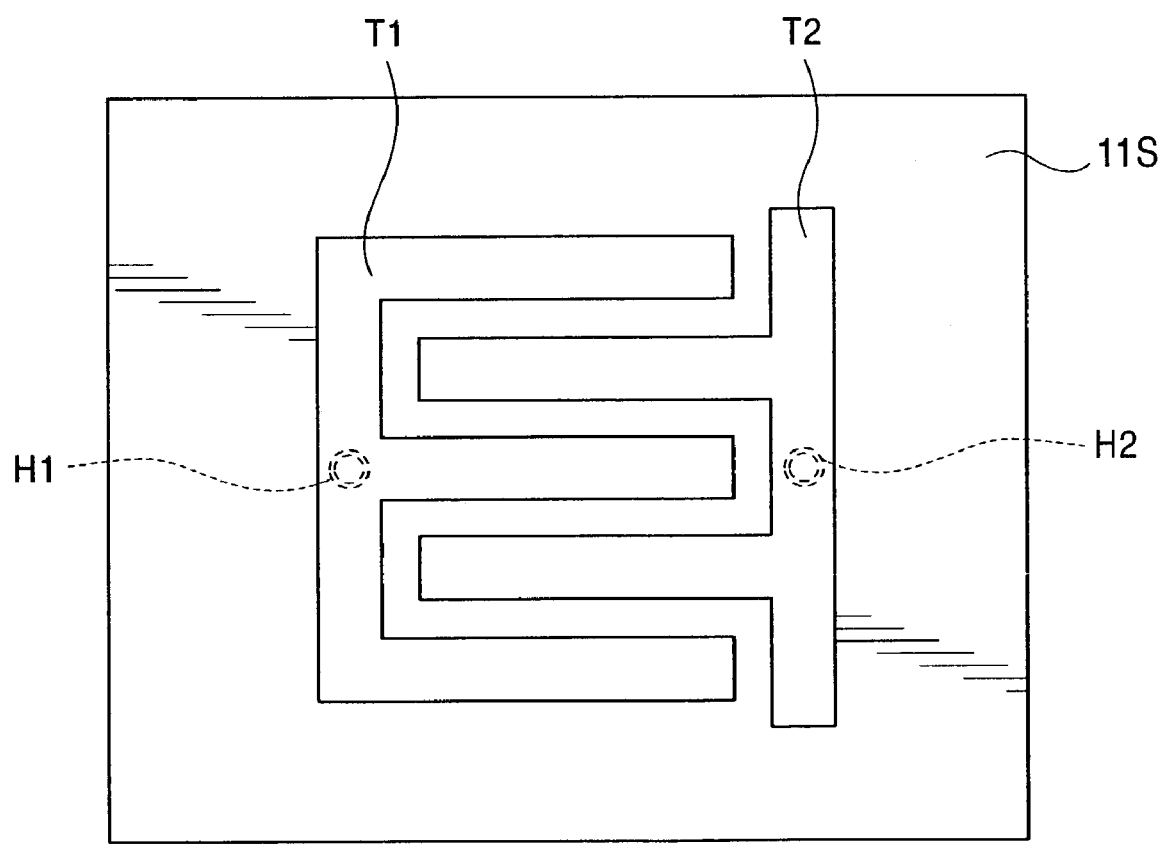
FIG. 12 is a top view (plan view) showing the construction of the main part of the sensor device according to the fourth embodiment of the present invention.

The touch sensor 203 is a capacitive sensor which detects a permittivity change as a capacitance change, and includes a pair of comb-like detection electrodes T1 and T2 which interlock with each other, as shown in FIG. 12.

The detection electrodes T1 and T2 are formed on the detection electrode layer 11S by printing a silver (Ag) pattern or the like, and a permittivity change between the detection electrodes T1 and T2 which occurs when a finger or the like approaches them is detected as a capacitance change. Among the two detection electrodes T1 and T2, one detection electrode T1 is connected to a terminal 13a on the chip mounting surface 13R with a through-hole electrode H1 which extends from the detection electrode layer 11S to the chip mounting surface 13R, and the other detection electrode T2 is connected to a terminal 13b with a through-hole electrode H2 which also extends from the detection electrode layer 11S to the chip mounting surface 13R.

An insulating protecting layer 80 is formed on the detection electrode layer 11S so as to protect the detection electrodes T1 and T2 from damages. The protecting layer 80 is constructed of, for example, a thin glass film, so that the finger or the like can sufficiently approach the detection electrodes T1 and T2 and cause a large capacitance change.

Similarly to the first embodiment, the circuit component 300 constructed of a bare chip is mounted at a position approximately directly below the detection electrodes T1 and T2. Terminals 13a and 13b for signal detection, a terminal 13c for power supply, a terminal 13d for grounding, and terminals 133 to 136 for signal output, all of which are formed on the chip mounting surface 13R, are connected to their respective aluminum terminals 300a of the circuit component 300 with gold bumps 310. One of the terminals 13a and 13b for signal detection (for example, the terminal 13b) is used for transmitting a drive signal, and an electrical signal such as a voltage is input to the circuit component 300 from the other one of the terminals 13a and 13b (for example, the terminal 13a) and is used for determining the capacitance change between the detection electrodes T1 and T2. The approach of a finger or the like is detected on the basis of this capacitance change. The detection result is output to an external device via the terminals 133 to 136 for signal output and external connection electrodes 14c to 14f.

The structure of the circuit component 300 and the method of attaching the circuit component 300 to the board 10 are similar to those of the first embodiment, and explanations thereof are thus omitted.

The sensor device 103 according to the fourth embodiment of the present invention is constructed as described above, and when a finger or the like approaches the detection electrodes T1 and T2, the permittivity between the detection electrodes T1 and T2 greatly changes, and accordingly the capacitance therebetween also changes. A signal representing the capacitance change is input to the circuit component 300, which is mounted at a position approximately directly below the detection electrodes T1 and T2, via the through-hole electrode H1, and the processing result obtained by the circuit component 300 is output to the external device via the external connection electrodes 14c to 14f on the connection electrode surface 14R.

Thus, similarly to the first embodiment, according to the sensor device 103 of the present embodiment, the signal representing the capacitance change can be input to the circuit component 300 over approximately the shortest distance. Accordingly, the influence of external noise can be minimized and the detection accuracy can be significantly improved.

Next, a fifth embodiment of the present invention will be described below with reference to FIG. 13. Components similar to those described above with reference to FIGS. 1 to 7 in the first embodiment are denoted by the same reference numerals, and explanations thereof are thus omitted.

Figure 13:
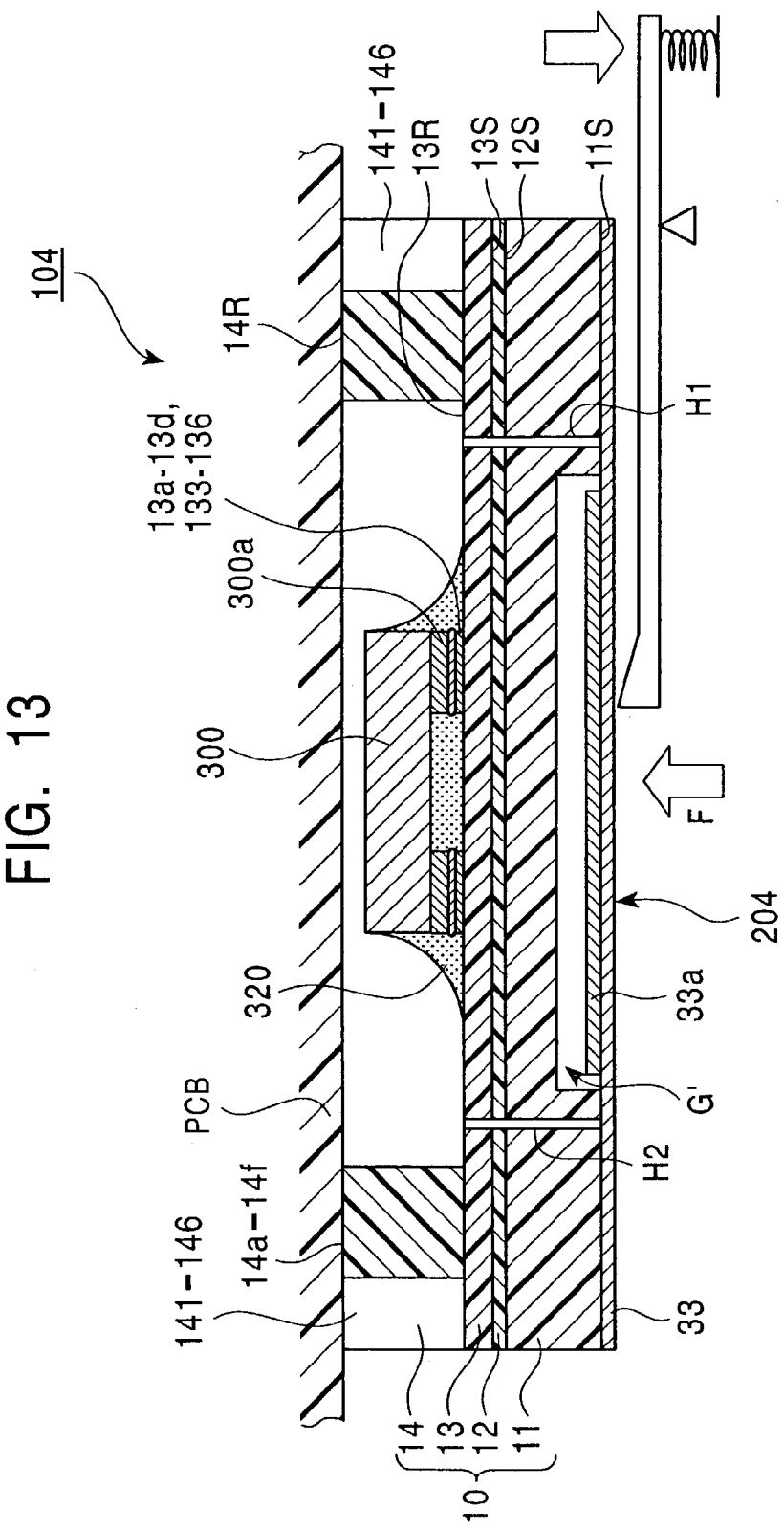
FIG. 13 is a schematic sectional view showing the overall construction of a sensor device according to a fifth embodiment of the present invention.

As shown in FIG. 13, a sensor device (detection device) 104 according to the present embodiment includes a detector unit 204 which serves as a load sensor on a detection electrode layer 11S of a board 10 and a circuit component 300 which processes an electrical signal detected by the load sensor 204 on the chip mounting surface 13R at the backside of the board 10.

Similarly to the first embodiment, the board 10 has a multilayer structure including plates 11 to 14, and surfaces 11S to 13S of the plates 11 to 13 at a first side thereof and surfaces 13R and 14R of the plates 13 and 14 at a second side thereof serve as a detection electrode layer, a ground layer, a power supply layer, a chip mounting surface, and a connection electrode surface, respectively. The ground layer 12S, the power supply layer 13S, the chip mounting surface 13R, and the connection electrode surface 14R are similar to those of the first embodiment, and explanations thereof are thus omitted.

The load sensor 204 is a resistive strain sensor which detects an elastic strain as a resistance change, and includes a leaf spring (elastic member) 33 constructed of, for example, a stainless steel plate which can be deformed elastically and a strain sensitive resistor 33a provided on the leaf spring 33.

The leaf spring 33 is attached to the detection electrode layer 11S, and an insulating film (not shown) composed of polyimide resin or the like is formed on the leaf spring 33 so that the leaf spring 33 is reliably insulated from the strain sensitive resistor 33a. The strain sensitive resistor 33a has a band-like shape which extends horizontally in FIG. 13, and is formed on the insulating film by, for example, screen printing. In addition, the leaf spring 33 is grounded by suitable means.

The strain sensitive resistor 33a is composed of a material such as carbon.

The detection electrode layer 11S has a recess G' which is not so deep as to extend through the plate 11 at a central position corresponding to the position where the strain sensitive resistor 33a is formed in the central region of the detection electrode layer 11S. Accordingly, the leaf spring 33 can be elastically deformed in the vertical direction in the recess G'.

The strain sensitive resistor 33a is connected to a pair of conductive patterns (not shown) formed on the insulating film at both ends thereof. These conductive patterns are connected to terminals 13a and 13b on the chip mounting surface 13R with through-hole electrodes H1 and H2 which extend from the detection electrode layer 11S to the chip mounting surface 13R. Accordingly, the resistance between both ends of the strain sensitive resistor 33a can be detected.

Similarly to the first embodiment, the circuit component 300 constructed of a bare chip is mounted at a position approximately directly opposite to the recess G'. Terminals 13a and 13b for signal detection, a terminal 13c for signal supply, a terminal 13d for grounding, and terminals 133 to 136 for signal output, all of which are formed on the chip mounting surface 13R, are connected to their respective aluminum terminals 300a of the circuit component 300 with gold bumps 310. The elastic force applied to the leaf spring 33 is calculated on the basis of the resistance between both ends of the strain sensitive resistor 33a which is obtained from the terminals 13a and 13b for signal detection. The calculation result is output to an external device via the terminals 133 to 136 for signal output and external connection electrodes 14c to 14f.

The structure of the circuit component 300 and the method of attaching the circuit component 300 to the board 10 are similar to those of the first embodiment, and explanations thereof are thus omitted.

The sensor device 104 according to the fifth embodiment of the present invention is constructed as described above, and when a stress F is applied to the sensor device 104 by a cantilever, the leaf spring 33 is elastically deformed, and accordingly the strain sensitive resistor 33a is also deformed. Thus, the strain sensitive resistor 33a extends and the resistance between both ends of the strain sensitive resistor 33a increases. The resistance change is input to the circuit component 300, which is mounted at a position approximately directly opposite to the recess G', via the through-hole electrodes H1 and H2, and the processing result obtained by the circuit component 300 is output to the external device via the external connection electrodes 14c to 14f on the connection electrode surface 14R.

Thus, similarly to the first embodiment, according to the sensor device 104 of the present embodiment, the signal representing the resistance change can be input to the circuit component 300 over approximately the shortest distance. Accordingly, the influence of external noise can be minimized and the detection accuracy can be significantly improved.

Next, a sixth embodiment of the present invention will be described below with reference to FIG. 14. Components similar to those described above with reference to FIGS. 1 to 7 in the first embodiment are denoted by the same reference numerals, and explanations thereof are thus omitted.

Figure 14:
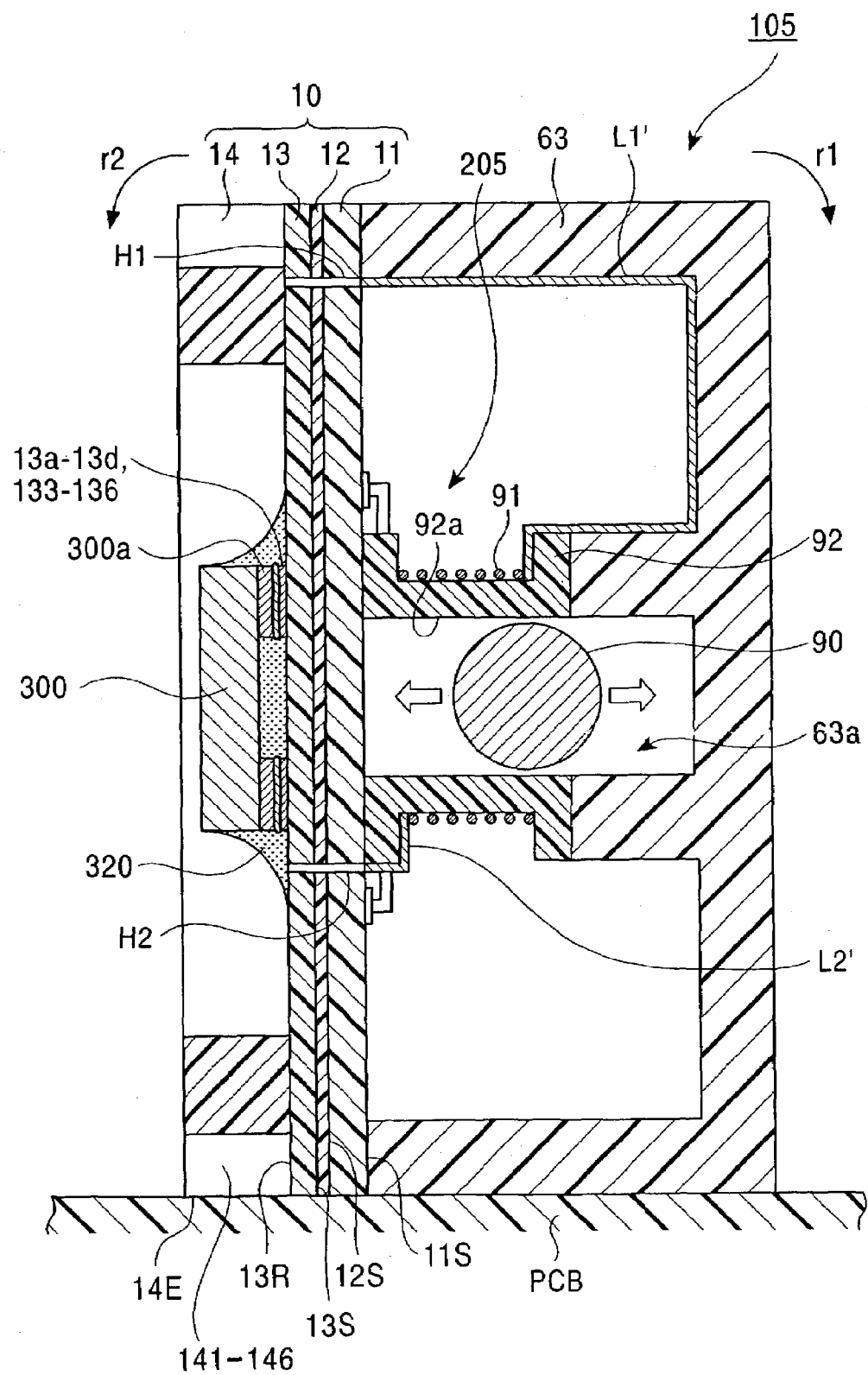
FIG. 14 is a schematic sectional view showing the overall construction of a sensor device according to a sixth embodiment of the present invention.

As shown in FIG. 14, a sensor device (detection device) 105 according to the present embodiment includes a detector unit 205 which serves as a tilt sensor on a detection electrode layer 11S of a board 10 and a circuit component 300 which processes an electrical signal detected by the tilt sensor 205 on a chip mounting surface 13R at the backside of the board 10.

Similarly to the first embodiment, the board 10 has a multilayer structure including plates 11 to 14, and surfaces 11S to 13S of the plates 11 to 13 at a first side thereof, a surface 13R of the plate 13 at a second side thereof, and a side surface 14E of the plate 14 serve as a detection electrode layer, a ground layer, a power supply layer, a chip mounting surface, and a connection electrode surface, respectively. The ground layer 12S, the power supply layer 13S, and the chip mounting surface 13R are similar to those of the first embodiment, and explanations thereof are thus omitted.

The tilt sensor 205 is a magnetic sensor which detects the amount of tilt of the sensor device 105 as an inductance change in a coil. As shown in FIG. 14, the tilt sensor 205 includes a coil 91 which is wound around a bobbin 92 and a sphere 90 which is loosely fitted in the bobbin 92 such that the sphere 90 can roll inside the bobbin 92.

The bobbin 92 is composed of a synthetic resin and is attached to the detection electrode layer 11S, and the coil 91 is wound around the bobbin 92 at the outer periphery thereof. In addition, the bobbin 92 has a hollow portion 92a at the axial center thereof, and the sphere 90, which is composed of a soft magnetic material having a high magnetic permeability, such as ferrite, is loosely fitted in the hollow portion 92a such that the sphere 90 can roll inside the hollow portion 92a.

In addition, a housing 63 having a cylindrical portion 63a which is formed continuously to the hollow portion 92a of the bobbin 92 is attached to the detection electrode layer 11S. When the sensor device 105 tilts, the sphere 90 rolls and moves in the direction from the hollow portion 92a to the cylindrical portion 63a, or in the direction from the cylindrical portion 63a to the hollow portion 92a, at a speed corresponding to the tilt angle. Accordingly, the inductance of the coil 91 changes.

The upper end and the lower end of the coil 91 are electrically connected to through-hole electrodes H1 and H2 which extend from the detection electrode layer 11S to the chip mounting surface 13R with metal leads L1' and L2', respectively, which are formed on the inner surface of the housing 63. Accordingly, the inductance change in the coil 91 can be detected when the sphere 90 moves inside the coil 91.

Similarly to the first embodiment, the circuit component 300 constructed of a bare chip is mounted at a position approximately directly opposite to the bobbin 92. Terminals 13a and 13b for signal detection, a terminal 13c for signal supply, a terminal 13d for grounding, and terminals 133 to 136 for signal output, all of which are formed on the chip mounting surface 13R, are connected to their respective aluminum terminals 300a of the circuit component 300 with gold bumps 310. Both ends of the coil 91 are connected to the circuit component 300 via the metal leads L1' and L2' and the through-hole electrodes H1 and H2 over approximately the shortest distance. The circuit component 300 determines the direction and speed of the movement of the sphere 90 on the basis of the amount and changing direction of the inductance, and calculates the direction and angle of tilt of the sensor device 105.

In the present embodiment, since the sensor device 105 must be mounted on a printed circuit board (PCB) while the board 10 is in the vertical orientation, the connection electrode surface 14E is formed on a side surface of the plate 14 which faces the printed circuit board (PCB). The processing result obtained by the circuit component 300 is output to an external device via the connection electrode surface 14E.

The structure of the circuit component 300 and the method of attaching the circuit component 300 to the board 10 are similar to those of the first embodiment, and explanations thereof are thus omitted.

The sensor device 105 according to the sixth embodiment of the present invention is constructed as described above, and when the sensor device 105 tilts rightward in FIG. 14, that is, in the direction shown by the arrow r1, the sphere 90 rolls and moves in the direction from the hollow portion 92a to the cylindrical portion 63a at a speed corresponding to the tilt angle. Accordingly, the inductance of the coil 91 decreases. On the contrary, when the sensor device 105 tilts leftward in FIG. 14, that is, in the direction shown by the arrow r2, the sphere 90 rolls and moves in the direction from the cylindrical portion 63a to the hollow portion 92a at a speed corresponding to the tilt angle. Accordingly, the inductance of the coil 91 increases.

Then, the detected electrical signals are input to the circuit component 300, which is mounted at a position approximately directly opposite to the bobbin 92, via the metal leads L1' and L2' and the through-hole electrodes H1 and H2. The processing result obtained by the circuit component 300 is output to the external deice via the external connection electrode surface 14E.

Thus, similarly to the first embodiment, according to the sensor device 105 of the present embodiment, the signals representing the inductance change can be input to the circuit component 300 over approximately the shortest distances. Accordingly, the influence of external noise can be minimized and the detection accuracy can be significantly improved.

The present invention is not limited to the above-described embodiments, and various modifications are possible within the scope of the present invention.

For example, in the above-described second embodiment, the shape of the metal plate 71 and the detection electrode 11a' is not limited to elliptical, and they may also have a rectangular shape having a long axis and a short axis. In this case, a function between the rotational angle and the output voltage can be arbitrarily set by adjusting the shape of the electrodes.

In addition, two detection electrodes 11a' and 11a' may be disposed on the detection electrode layer 11S, and the metal plate 71 may be disposed such that it is slightly inclined with respect to the detection electrodes 11a' and 11a'. In this case, not only the amount of rotation but also the rotational direction of the bar 70 can be determined by obtaining the capacitance changes between the metal plate 71 and the two detection electrodes 11a' and 11a'.

In addition, the sensor device 102 according to the third embodiment can also be used as a capacitive load sensor device by removing the housing 62.

In addition, in the above-described sixth embodiment, the connection electrode surface 14E is formed only on a side surface of the plate which faces the printed circuit board (PCB). However, the connection electrode surface may also be formed on the surface at the opposite side so that the sensor device 105 can also be mounted on the printed circuit board (PCB) in the opposite orientation.

What is claimed is:

1. A detection device comprising:
   a detector unit which is provided on an insulating board at a first side of the board;
   a circuit component which is provided on the board at a second side of the board and which processes a signal detected by the detector unit; and
   a wiring unit which penetrates through the board in the thickness direction of the board and connects the detector unit and the circuit component,
   wherein the wiring unit includes a through-hole electrode which penetrates through the board in the thickness direction of the board,
   wherein the circuit component is a bare integrated circuit chip which includes a semiconductor substrate and a circuit unit formed on the semiconductor substrate, and the bare chip is mounted on the board at the second side,
   wherein the bare chip is connected to the board at the second side such that the circuit unit faces the surface of the board at the second side by bump bonding,
   wherein the semiconductor substrate is electrically connected to a ground pattern formed on the board,
   wherein the detector unit includes a detection electrode and a counter electrode, the detection electrode being provided on the board at the first side and the counter electrode being disposed such that the counter electrode faces the detection electrode and being movable with respect to the detection electrode, and is constructed as a capacitive sensor which detects a capacitance between the detection electrode and the counter electrode.

2. A detection device according to claim 1, wherein the board is a multilayer wiring board which includes a ground layer whose potential is set to a ground potential at a position between a surface of the board at the first side and a surface of the board at the second side.

3. A detection device according to claim 2, wherein the multilayer wiring board further includes a power supply layer at a position between the ground layer and the surface of the board at the second side, and wherein the ground layer is disposed at a position closer to the power supply layer than to the surface of the board at the first side.

4. A detection device according to claim 1, wherein to board is provided with a plurality of external connection electrodes which are electrically connected to the circuit component.

* * * * *